United States Patent
Matsuyama et al.

(10) Patent No.: US 8,588,566 B2
(45) Date of Patent: Nov. 19, 2013

(54) ELECTRONIC APPARATUS, CELLULAR PHONE, FLEXIBLE CABLE AND METHOD FOR MANUFACTURING OPTICAL WAVEGUIDE FORMING BODY

(75) Inventors: Mutsuhiro Matsuyama, Kawasaki (JP); Koji Choki, Kawasaki (JP); Tetsuya Mori, Kawasaki (JP); Kei Watanabe, Fujisawa (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 293 days.

(21) Appl. No.: 12/997,136

(22) PCT Filed: Jun. 9, 2009

(86) PCT No.: PCT/JP2009/060512
§ 371 (c)(1),
(2), (4) Date: Dec. 9, 2010

(87) PCT Pub. No.: WO2009/151045
PCT Pub. Date: Dec. 17, 2009

(65) Prior Publication Data
US 2011/0085771 A1    Apr. 14, 2011

(30) Foreign Application Priority Data
Jun. 10, 2008   (JP) ................. 2008-151713

(51) Int. Cl.
*G02B 6/26* (2006.01)
*G02B 6/42* (2006.01)
*G02B 6/36* (2006.01)

(52) U.S. Cl.
USPC ............... 385/52; 385/31; 385/32; 385/39; 385/47; 385/49; 385/88; 385/89; 385/92; 385/94

(58) Field of Classification Search
USPC ................................................. 385/47, 52
See application file for complete search history.

(56) References Cited

U.S. PATENT DOCUMENTS

| 3,950,073 A | 4/1976 | Horiguchi et al. |
| 5,737,458 A | 4/1998 | Wojnarowski et al. |

(Continued)

FOREIGN PATENT DOCUMENTS

| JP | 50-9442 | 1/1975 |
| JP | 6-308519 | 11/1994 |

(Continued)

OTHER PUBLICATIONS

International Search Report issued Jul. 14, 2009 in Application No. PCT/JP2009/060512 (With English Translation).

(Continued)

*Primary Examiner* — Ryan Lepisto
(74) *Attorney, Agent, or Firm* — Oblon, Spivak, McClelland, Maier & Neustadt, L.L.P.

(57) ABSTRACT

According to the electronic apparatus and cellular phone of the present invention, in an optical waveguide forming body of a flexible cable, an air layer is provided in a deforming section which experiences bending deformation as a result of the movement of a second body relative to a first body (either a pivoting or sliding movement), and the position of this air layer becomes located on the outer circumferential side of a core when the deforming section undergoes bending deformation. As a result of this, it is possible to ensure sufficient flexibility and to also achieve a sufficient improvement in the folding endurance of the core portion for this optical waveguide forming body to be utilized in practical applications. Moreover, it is possible to suppress light loss and achieve high-speed, large-capacity transmissions even when the optical waveguide forming body of a flexible cable experiences bending deformation due to the relative movement of the second body relative to the first body.

22 Claims, 15 Drawing Sheets

(56) References Cited

U.S. PATENT DOCUMENTS

| | | | |
|---|---|---|---|
| 6,586,722 B1 * | 7/2003 | Kenny et al. | 250/227.16 |
| 2002/0076188 A1 | 6/2002 | Kimerling et al. | |
| 2002/0122648 A1 | 9/2002 | Mule' et al. | |
| 2010/0104240 A1 * | 4/2010 | Sano et al. | 385/14 |

FOREIGN PATENT DOCUMENTS

| | | |
|---|---|---|
| JP | 2002-182049 | 6/2002 |
| JP | 2003-207661 | 7/2003 |
| JP | 2004-53827 | 2/2004 |
| JP | 2005-70324 | 3/2005 |
| JP | 2005-91469 | 4/2005 |
| JP | 2006-10888 | 1/2006 |
| JP | 2006-113333 | 4/2006 |
| JP | 2006-323318 | 11/2006 |
| JP | 2007-212899 | 8/2007 |
| JP | 2008-286919 | 11/2008 |
| WO | WO 02/33457 A2 | 4/2002 |
| WO | WO 02/33457 A3 | 4/2002 |

OTHER PUBLICATIONS

Koji Choki, et al., "3S05 photo Address-ho de Keisei Shita Polymer Hikari Doharo", Polymer Preprints, vol. 56, No. 2, pp. 4695-4696.

Koji Choki, et al., "7221 Koseino Polymer Hikari Doharo kara naru Hikari Denki Fukugo Haisen Kiban", Dai 39 Kai Abstracts of Autumn Meeting of the Society of Chemical Engineers, 2007, 1 page.

* cited by examiner

ELECTRONIC APPARATUS, CELLULAR PHONE, FLEXIBLE CABLE AND METHOD FOR MANUFACTURING OPTICAL WAVEGUIDE FORMING BODY

TECHNICAL FIELD

The present invention relates to an electronic apparatus including a first body on which electronic parts are mounted, a second body which is able to rotate or slide relatively to the first body, and a flexible cable which functions as a signal line connecting the first body and the second body, and to a cellular phone, a flexible cable, and a method for manufacturing an optical waveguide forming body.

Priority is claimed on Japanese Patent Application No. 2008-151713, filed Jun. 10, 2008, the contents of which are incorporated herein by reference.

TECHNICAL BACKGROUND

Cellular phones generally include a main body on which operating buttons are provided, and with a movable body which either rotates or slides relatively to the main body. A circuit board provided on the main body and a circuit board provided on the movable body are connected together by means of a flexible signal line (hereinafter, referred to as a flexible cable). A cable formed by housing a thin metal wire inside a flexible resin tube, or a flexible wiring substrate is employed as the flexible cable.

For example, in the case of a folding type of cellular phone, the movable body is pivotably joined by means of a hinge portion to the main body, and the flexible cable is laid inside the device so as to pass adjacent to the center of rotation formed by the hinge portion of the movable body (see, for example, Patent documents 1 and 2).

In recent years, there have been demands for increases in both speed and transmission capacity in signal transmissions inside electronic devices such as gaming devices, electronic dictionaries, PDA (personal digital assistants), personal computers, and measuring instruments such as testers. In consideration of these demands, it is becoming common for optical communication technology, which uses a photoelectrical composite substrate which is formed by stacking optical waveguide forming components (these may be referred to below simply as optical waveguides) and sheet-shaped optical waveguides on a circuit board so as to create an integrated body in order to be applied to a signal transmissions within a device.

In addition to conventional quartz-based optical waveguides, polymer-based optical waveguides which are easy to manufacture (i.e., to pattern) and have widespread applicability are used as the optical waveguide. In recent years, development of the latter optical waveguides has been carried out vigorously. It is normal for these optical waveguides to be treated as a single substrate forming component either independently, or by being stacked on a circuit substrate like the aforementioned photoelectrical composite substrate, and to be formed as a rigid material.

Moreover, among these rigid optical waveguides, in order to reduce transmission loss in transmission light (here, this refers particularly to radiation loss), optical waveguides are known where air contacting with a core portion via holes and trenches and the like formed in cladding portions functions as over-cladding, and provides an improved light confinement effect (see, for example, Patent documents 1, 2, and 3).

[Patent document 1] Japanese Patent Application, First Publication No. 2005-091469

[Patent document 2] Japanese Patent Application, First Publication No. 2005-070324

[Patent document 3] Japanese Patent Application, First Publication No. 2003-207661

DISCLOSURE OF THE INVENTION

Problems to be Solved by the Invention

However, for example, as in existing cellular phones, in electronic devices that includes a main body and with a movable body which either rotates or slides relatively to the main body, the current situation is actually that optical waveguides are not being used in the flexible cable used for transmitting signals between the main body and movable body. Little progress has been made towards the introduction of optical waveguides inside devices.

As has been described above, it is normal for a conventional optical waveguide to be formed as a rigid material in order to be used as a single substrate forming component. Typically, the core and cladding portions of this optical waveguide are formed from solid materials. In other words, no consideration has been given to the use of conventional optical waveguides in applications requiring flexibility. Because of this, they cannot be used as flexible cables.

Bending deformation is applied to the flexible cable used for transmitting signals between the main body and the movable body which either rotates or slides relatively to the main body. In order to adapt an optical waveguide as the flexible cable, it must have sufficient flexibility to enable it to perform bending (i.e., curving) deformation. Moreover, it is necessary for optical loss (i.e., bending loss) due to the bending (i.e., curvature) in the predicted bend radius to be small, while still enabling optical signals to be transmitted.

Several polymer-based optical waveguides capable of undergoing bending deformation have been proposed. However, it is not easy to develop a practical optical waveguide that enables a contraction in the bend radius to be achieved while securing a state where satisfactory optical signal transmissions are possible. For example, users require that the flexible cable of a folding type of cellular phone should be able to be bent at a bend radius of approximately 1 to 5 mm. In this case, it is necessary for the optical waveguide to be able to be bent at a small bend radius of 1 to 5 mm, while still keeping optical loss small enough to allow optical signal transmissions to be performed satisfactorily when the optical waveguide is bent at this bend radius. For example, if the optical waveguide is formed in the shape of a thin sheet (having a thickness of, for example, $\mu$m 200 m or less), then the bend radius can be made extremely small. However, it becomes difficult to secure folding endurance in the optical waveguide if it is simply formed into a thin sheet. Note that this bending endurance refers to a mechanical endurance that makes it difficult for crimping and the like (for example, folds, fractures and the like in the core portion) which cause optical loss to increase to be generated. These problems present sizable obstructions to practical usefulness when an optical waveguide is used for the flexible cable.

The present invention was conceived in view of the above described circumstances, and it is an object thereof to provide the following.

Namely, the present invention provides an electronic apparatus, a cellular phone, a flexible cable, and a method for manufacturing an optical waveguide forming body that make it possible to secure sufficient flexibility and a high level of folding endurance in an optical waveguide forming body of a flexible cable for transmitting signals that connects together a first body of an electronic apparatus and a second body thereof that moves relatively to this first body. In addition, the present invention also enable optical loss to be suppressed and high-speed, large-capacity transmissions to be performed even when the flexible cable for the optical waveguide experiences bending deformation as a result of the relative movement of the second body relative to the first body.

Means for Solving the Problem

In order to solve the above described problems, the present invention employs the following means.

A first embodiment of the present invention is an electronic apparatus that has a first body on which electronic components are mounted, a second body that is able to move relatively to the first body, and a flexible cable that is used to transmit signals between the first body and the second body. The flexible cable has: an optical waveguide forming body that is made of resin and is flexible and is formed in a belt shape or a linear shape; and a deforming section that undergoes bending deformation in conjunction with the relative movement of the second body relative to the first body. The optical waveguide forming body has: a core portion that extends in the longitudinal direction of the optical waveguide forming body; cladding portions whose refractive index is lower than that of the core portion; and an internal air cladding portion that is in contact with the core portion at a position thereof that corresponds to the deforming section of the flexible cable and that incorporates internal air cladding layers which extend in the longitudinal direction of the core portion. The cladding portions are internally provided with either one or a plurality of core portions that are placed beside each other in parallel rows, and the air layers are provided in the internal air cladding portion so as to be on the outer circumferential side of the core portion when bending deformation is applied to the deforming section.

A second embodiment of the present invention is the electronic apparatus according to the first embodiment where the second body is pivotably connected via a hinge portion to the first body. And, the flexible cable is laid so as to pass through the hinge portion. And, the deforming section of the flexible cable is located in the vicinity of the hinge portion between the first body and the second body.

A third embodiment of the present invention is the electronic apparatus according to the first embodiment where the second body is provided so as to be able to slide relatively to the first body along guide rails that are provided in the first body. And, the deforming section that undergoes bending deformation in conjunction with the sliding movement of the second body relative to the first body is located between the first body and the second body.

A fourth embodiment of the present invention is the electronic apparatus according to the first embodiment where the air layers are provided in the internal air cladding portion of the optical waveguide forming body at a position which is on the inner circumferential side and at a position which is on the outer circumferential side so as to sandwich the core portion when bending deformation is applied to the deforming section.

A fifth embodiment of the present invention is the electronic apparatus according to the first embodiment where the flexible cable has the optical waveguide forming body, and with a belt-shaped flexible wiring substrate that extends the length of the optical waveguide forming body and is bonded to the optical waveguide forming body. And, bending deformation is applied to the deforming section in such a direction that the optical waveguide forming body becomes located on the inner circumferential side of the flexible wiring substrate.

A sixth embodiment of the present invention is the electronic apparatus according to the fifth embodiment, where the flexible wiring substrate has an electrically non-conductive base film, and a conductor layer that is provided on one surface of this base film And. the conductor layer is bonded to the optical waveguide forming body so as to be on the opposite side thereof from the optical waveguide forming body sandwiching the base film.

A seventh embodiment of the present invention is the electronic apparatus according to the fifth embodiment, where the first body and the second body are each provided with a cable connecting portion that has a light emitting element or a photoreceptor element that is optically connected to the optical waveguide forming body of the flexible cable, and with an electrode portion that is electrically connected to a conductive circuit formed by the conductor layer of the flexible wiring substrate of the flexible cable. And, the flexible cable is equipped with connectors that are located at both ends thereof and that are used to create optical connections between the optical waveguide forming body and the optical elements, and to create electrical connections between the conductive circuit formed by the conductor layer of the flexible wiring substrate and the electrode portion.

An eighth embodiment of the present invention is the electronic apparatus according to the sixth embodiment where the first body and the second body are each provided with a cable connecting portion that is equipped with a light emitting element or a photoreceptor element that is optically connected to the optical waveguide forming body of the flexible cable, and an electrode portion that is electrically connected to a conductive circuit formed by the conductor layer of the flexible wiring substrate of the flexible cable. And the flexible cable has connectors that are located at both ends thereof and that are used to create optical connections between the optical waveguide forming body and the optical elements, and to create electrical connections between the conductive circuit formed by the conductor layer of the flexible wiring substrate and the electrode portion.

A ninth embodiment of the present invention is the electronic apparatus according to the first embodiment where the optical waveguide forming body has a core layer, where either one or a plurality of core portions that are placed beside each other in parallel rows are formed between a pair of cladding layers whose refractive index is lower than that of the core portions. And, portions of the core layer other than where the core portions are located and also the cladding layers are formed as a cladding portion whose refractive index is lower than that of the core portion. And, the optical waveguide forming body has the internal air cladding portion where the air layers are secured by trenches that are formed extending in the longitudinal direction of the core portion in locations facing the core portion of either one or both of the cladding layers on both sides of the core layer.

A tenth embodiment of the present invention is the electronic apparatus according to the ninth embodiment where the core layer of the optical waveguide forming body has a cyclic olefin-based resin as the primary material thereof, and the core portion is formed by the irradiation of active energy light rays or electron beams onto portions of a core layer laminated body that is formed by a resin composition whose refractive index is changed by the irradiation thereon of active energy light rays or electron beams, or by the application thereto of heat.

An eleventh embodiment of the present invention is a cellular phone that serves as the electronic apparatus according to any one of the first through tenth embodiments.

A twelfth embodiment of the present invention is a flexible cable that is provided in an electronic apparatus that has a first body on which electronic components are mounted, and a second body that pivots or slides relatively to the first body so as to serve as a signal wire that connects together the first body and the second body. The flexible cable has an optical waveguide forming body that is made of resin and is flexible and is formed in a belt shape or a linear shape. And, the optical waveguide forming body has: a core layer where either one or a plurality of the core portions of this optical waveguide forming body that are placed beside each other in parallel rows are formed between a pair of cladding layers; a cladding portion where portions of the core layer other than where the core portions are located and also the cladding layers have a refractive index which is lower than that of the core portions; and an internal air cladding portion that is located in a center portion in the longitudinal direction of the optical waveguide forming body, and where air layers that are in contact with the core portions are secured by trenches that are formed extending in the longitudinal direction of the core portions in locations facing the core portion of the cladding layers.

A thirteenth embodiment of the present invention is the flexible cable according to the twelfth embodiment where there is further provided a belt-shaped flexible wiring substrate that extends along the length of the optical waveguide forming body and is bonded to the optical waveguide forming body.

A fourteenth embodiment of the present invention is the flexible cable according to the thirteenth embodiment, where the flexible wiring substrate has an electrically non-conductive base film, and a conductor layer that is provided on one surface of this base film. And, the conductor layer is bonded to the optical waveguide forming body so as to be on the opposite side thereof from the optical waveguide forming body sandwiching the base film.

A fifteenth embodiment of the present invention is the flexible cable according to the thirteenth embodiment, where the flexible cable has connectors that are located at both ends thereof and that are used to create optical connections between the optical elements provided in the electronic apparatus and the optical waveguide forming body, and to create electrical connections between the electronic circuits provided in the electronic apparatus and the conductive circuit formed by the conductor layer of the flexible wiring substrate.

A sixteenth embodiment of the present invention is the flexible cable according to the fourteenth embodiment, where the flexible cable has connectors that are located at both ends thereof and that are used to create optical connections between the optical elements provided in the electronic apparatus and the optical waveguide forming body, and to create electrical connections between the electronic circuits provided in the electronic apparatus and the conductive circuit formed by the conductor layer of the flexible wiring substrate.

A seventeenth embodiment of the present invention is a method of manufacturing an optical waveguide forming body that is made of resin and is flexible and is formed in a belt shape or a linear shape, and that has a core layer having either one or a plurality of core portions between a pair of cladding layers, a cladding portion where the refractive index of portions of the core layer other than the core portions and of the cladding layers is lower than that of the core portions, and an internal air cladding portion that is located in a center portion in the longitudinal direction of the optical waveguide forming body, and where air layers that are in contact with the core portions are secured by trenches that are formed in locations facing the core portions of the pair of cladding layers. The method of manufacturing an optical waveguide forming body includes: a core layer formation step where, after ultraviolet light has been irradiated onto portions of a core layer formation film material that contains a first photo-acid generating agent that is activated by the irradiation thereon of ultraviolet light and generates an acid in a polymer having a main chain and a leaving group that branches off this main chain, the core layer formation film material is heated so as to create a refractive index difference between irradiated areas of the core layer formation material where ultraviolet light was irradiated and non-irradiated areas thereof where ultraviolet light was not irradiated, and so as to also cure the core layer formation material and thereby enable the core layer of the optical waveguide forming body to be obtained; a thermocompression bonding step where a cladding layer formation film material that has the trenches are formed on one surface thereof and that is formed in a film shape from a material that contains a second photo-acid generating agent that has a different absorption maximum wavelength from that of the first photo-acid generating agent and that is activated by the irradiation thereon of ultraviolet light and generates an acid in a polymer having a polymeric group is thermocompression bonded onto both sides of the core layer, so that a material laminated body made up of the core layer and the cladding layer formation film material is obtained; and a cladding formation step where, after ultraviolet light having a wavelength that includes the absorption maximum wavelength of the second photo-acid generating agent but does not include the absorption maximum wavelength of the first photo-acid generating agent has been irradiated onto the material laminated body, the material laminated body is heated so that the cladding layer formation film material is cured and the cladding layers are obtained.

An eighteenth embodiment of the present invention is the method of manufacturing an optical waveguide forming body according to the seventeenth embodiment, where in the thermocompression bonding step, a varnish that contains the cladding layer formation material is coated onto a flexible wiring substrate so as to form the cladding layer formation film material, and this cladding layer formation film material and a separately manufactured cladding layer formation film material and the core layer are mutually laminated and thermocompression-bonded together. A nineteenth embodiment of the present invention is the method of manufacturing an optical waveguide forming body according to the seventeenth embodiment where the polymer of the core layer formation film material and/or the polymer of the cladding layer formation film material are norbornene-based polymers.

A twentieth embodiment of the present invention is the method of manufacturing an optical waveguide forming body according to the eighteenth embodiment, where the polymer of the core layer formation film material and/or the polymer of the cladding layer formation film material are norbornene-based polymers.

A twenty-first embodiment of the present invention is the flexible cable according to the twelfth embodiment, where the flexible cable is equipped with an optical waveguide forming body manufactured using the method of manufacturing an optical waveguide forming body according to the seventeenth embodiment.

A twenty-second embodiment of the present invention is the electronic apparatus according to the first embodiment, where the flexible cable is the flexible cable according to the twenty-first embodiment.

A twenty-third embodiment of the present invention is an optical waveguide forming body that is made of resin and is flexible and is formed in a belt shape or a linear shape, and includes: a core portion that extends in the longitudinal direction of the optical waveguide forming body; a cladding portion whose refractive index is lower than that of the core portion; and an internal air cladding portion that has an internal air layer that is in contact with the core portion and extends in the longitudinal direction of this core portion. And, the cladding portion is internally provided with either one or a plurality of the core portions that are placed beside each other in parallel rows, and the air layers are provided in the internal air cladding portion so as to be on the outer circumferential side of the core portion when bending deformation is applied to the optical waveguide forming body.

Effects of the Invention

According to the electronic apparatus and cellular phone of the present invention, in the optical waveguide forming body of a flexible cable, an air layer is provided in a deforming section which experiences bending deformation as a result of the movement of a second body relative to a first body (either a pivoting or sliding movement), and the position of this air layer becomes located on the outer circumferential side of a core when the deforming section undergoes bending deformation. As a result of this, it is possible to secure sufficient flexibility, and to also improve the folding endurance of the core portion. Accordingly, as a result of the folding endurance of the optical waveguide forming body in response to repeated bending being improved, it is possible to ensure a satisfactory folding endurance for practical applications in the optical waveguide forming body. Moreover, it is possible to inhibit optical loss even when bending deformation is applied to the optical waveguide forming body of the flexible cable by the relative movement of the second body relative to the first body, and high-speed, large-capacity transmissions can be achieved.

Moreover, the structure of the flexible cable of the present invention is a simple one. In addition, by employing the manufacturing method for an optical waveguide forming body of the present invention, it is possible to obtain the optical waveguide forming body of the flexible cable easily and at low-cost.

Figure 1:
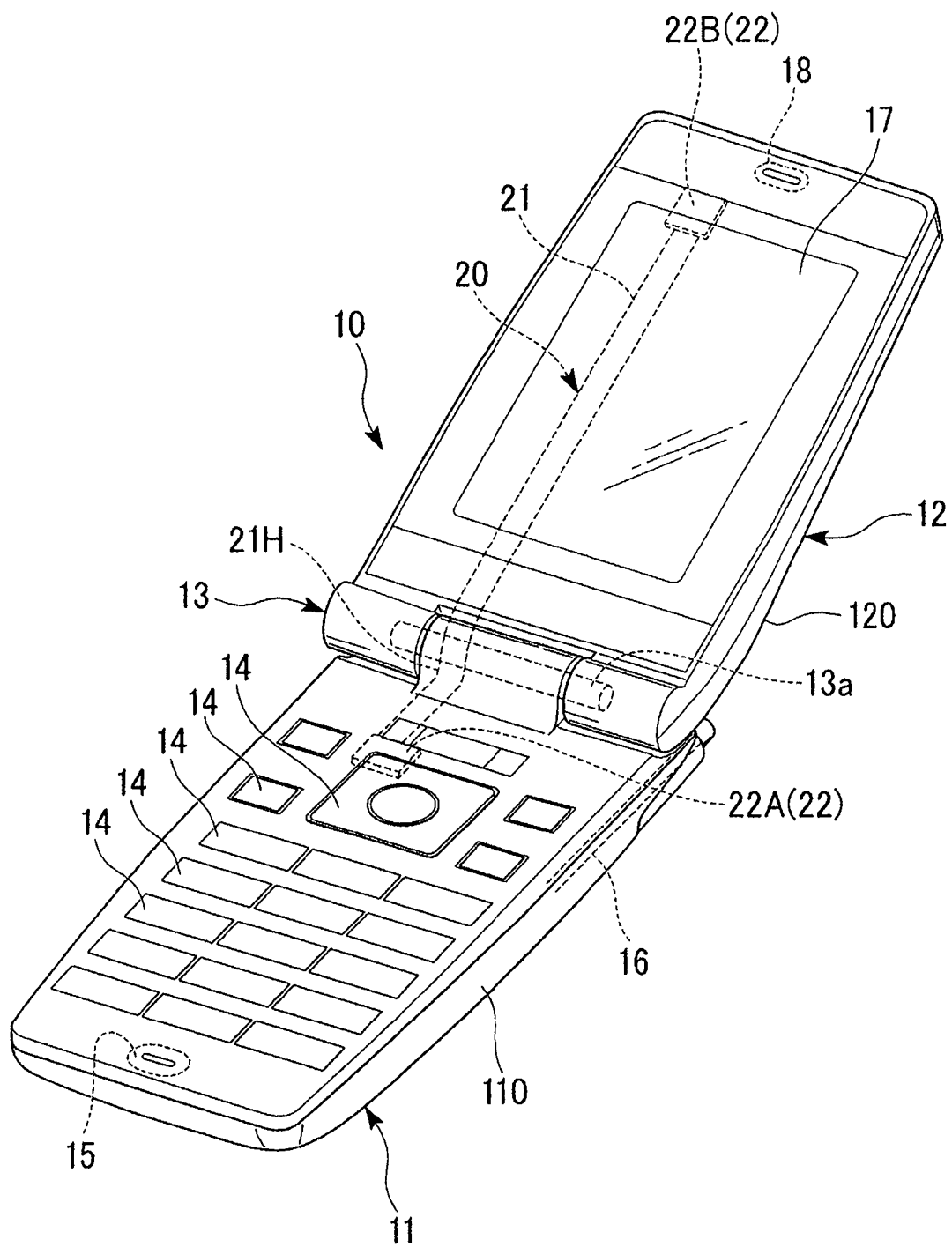
FIG. 1 is a perspective view showing a cellular phone of a first embodiment of the present invention.

DESCRIPTION OF THE REFERENCE NUMERALS 10, 10A, 10B, 10C . . . Cellular phone, 11, 11A . . . First body, 111, 111A . . . Circuit board, 112 . . . Optical element (Light emitting element), 113 . . . Engagement recess, 114 . . . Connector connecting portion, 115 . . . Electrode portion, 12, 12A . . . Second body, 121, 121A . . . Circuit board, 122 . . . Optical element (Photo receptor element), 123 . . . Engagement recess, 124 . . . Connector connecting portion, 125 . . . Electrode portion, 13 . . . Hinge portion, 13a . . . Pivot shaft, 20, 20A . . . Flexible cable, 21, 21' . . . Optical waveguide forming body, 21a . . . Core portion, 21b . . . Cladding portion, 21b1 . . . Outer circumferential side bend portion, 21c . . . Air layer, 21c1 . . . First air layer, 21c2 . . . Second air layer, 21d . . . Air cladding internal portion, 21e . . . Trenches, 21f . . . Center portion, 21H . . . Deforming section, 211, 211' . . . Core layer, 212, 212' . . . Cladding layer, 213, 213' . . . Cladding layer, 22, 22A, 22B . . . Connector, 23 . . . Flexible wiring substrate, 231 . . . Base film, 232 . . . Conductor layer, 232a . . . Conductor circuit, 24 . . . Cable body, 24H, 24H1 . . . Deforming section, 24W . . . Bent portion, 25, 25A, 25B . . . Connector, 251 . . . Connecting terminal, 252 . . . Energizing contact component, 31 . . . Core layer formation film material, 32 . . . Photomask, 32a (Photomask) Aperture, 33A . . . First ultraviolet light, 33B . . . Second ultraviolet light, 34 . . . Cladding layer formation film material, 35 . . . Material laminated body, 36 . . . wavelength cut filter, 38 . . . Laser, 51 . . . First body, 52 . . . Second body, 511 . . . Circuit board, 521 . . . Circuit board.

[Best Embodiments for Implementing the Invention]

Embodiments of the present invention will now be described with reference made to the drawings.

(First Embodiment)

Firstly, a first embodiment of the present invention will be described.

Figure 2A:
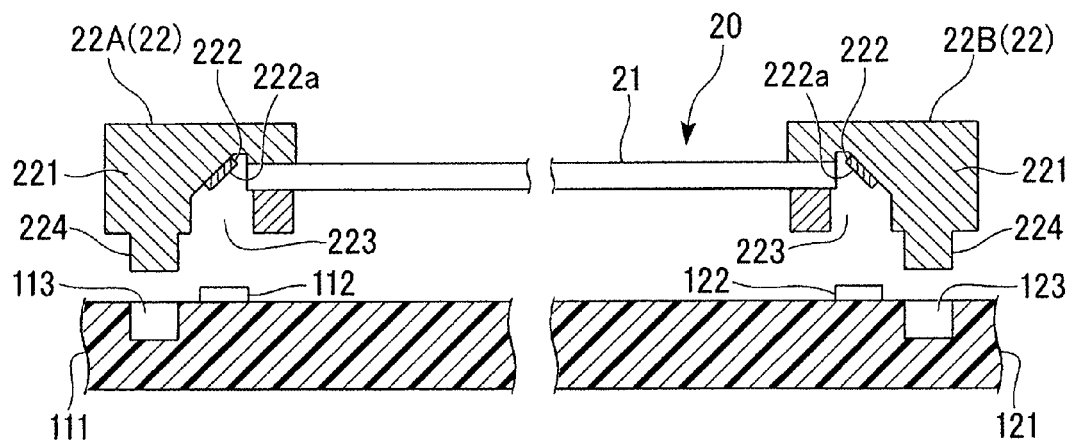
FIG. 2A is a view showing a relationship between a circuit board inside a first body and a circuit board inside a second body of the cellular phone shown in FIG. 1 and a flexible cable (i.e., a cable fitted with a connector) used for transmitting signals.
Figure 2B:
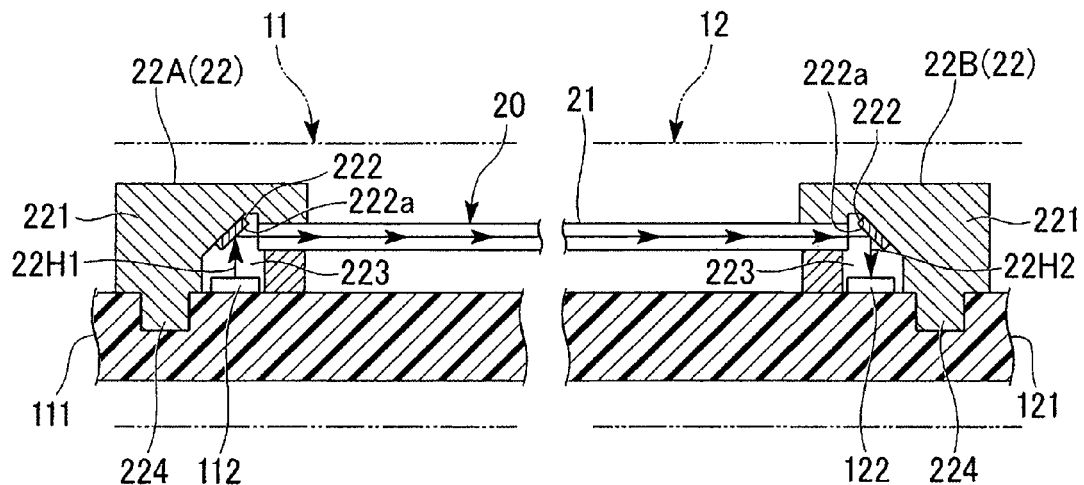
FIG. 2B is a view showing a relationship between a circuit board inside a first body and a circuit board inside a second body in the cellular phone shown in FIG. 1 and a flexible cable (i.e., a cable fitted with a connector) used for transmitting signals.
Figure 3:
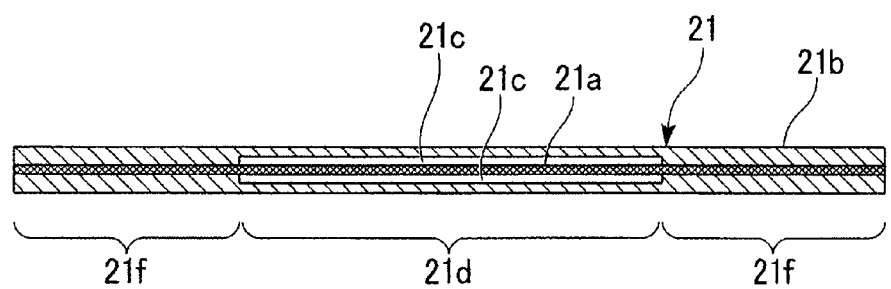
FIG. 3 is a cross-sectional view showing the structure (i.e., the structure of a cross-section extending in the longitudinal direction of the optical waveguide forming body) of an optical waveguide forming body of the flexible cable of the cellular phone shown in FIG. 1.
Figure 4:
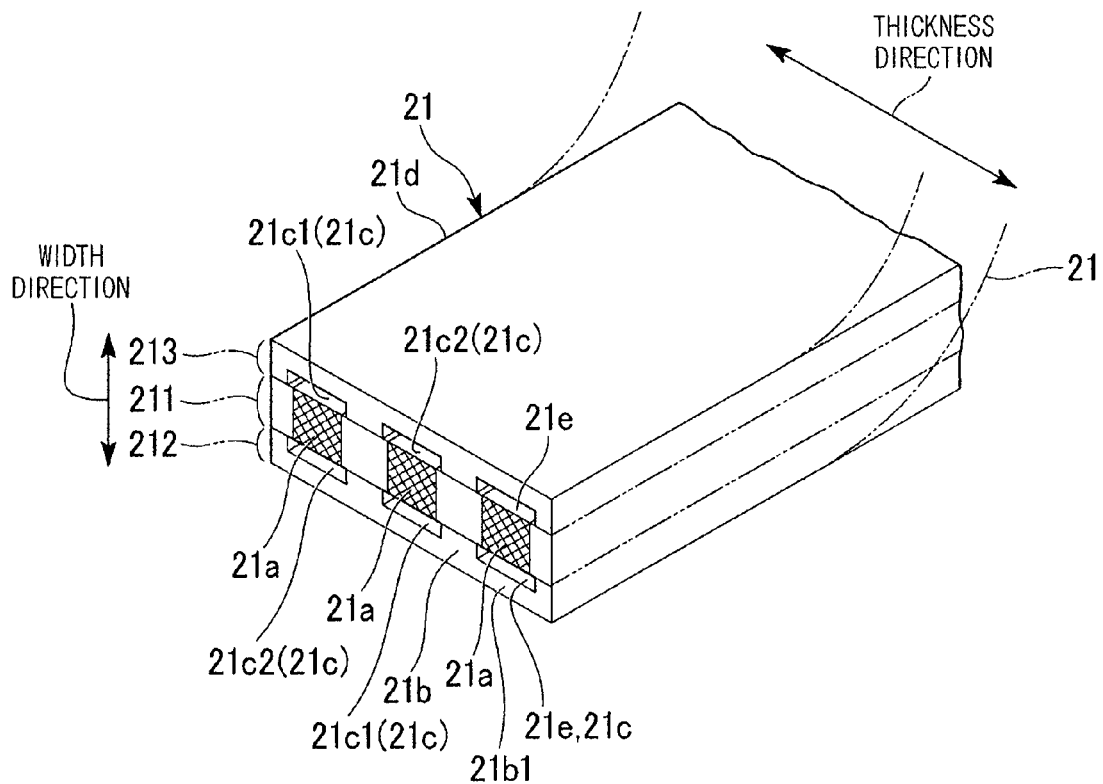
FIG. 4 is a cross-sectional perspective view showing the structure of the optical waveguide forming body shown in FIG. 3.
Figure 5:
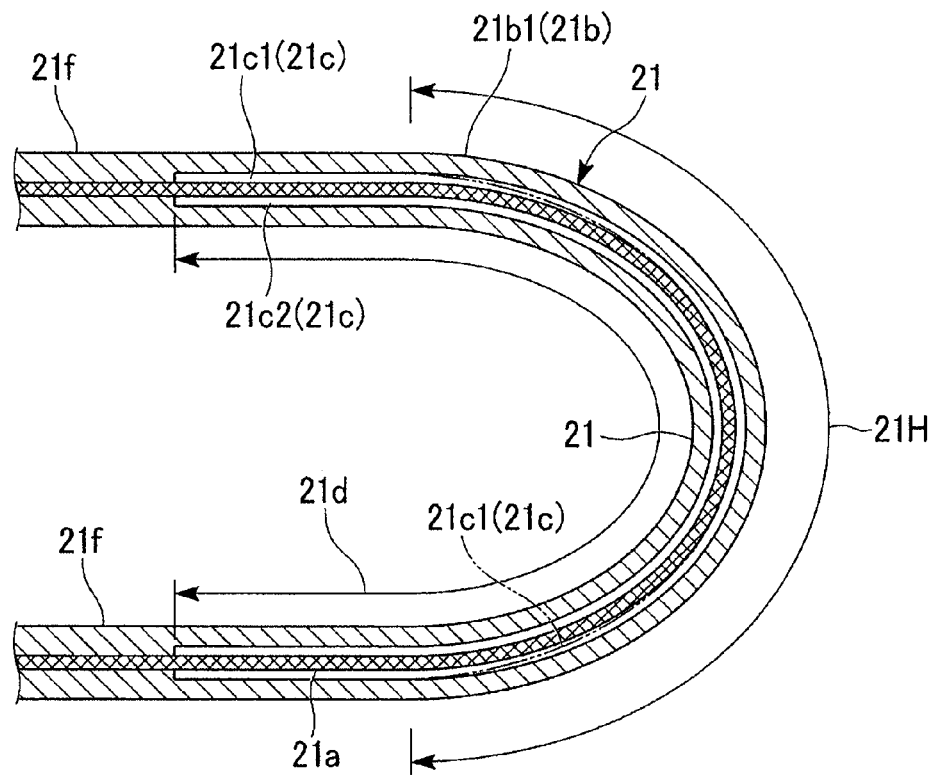
FIG. 5 is an enlarged cross-sectional view showing a state where bending deformation has been applied to a deforming section of the optical waveguide forming body shown in FIG. 3.

FIG. 1 is a perspective view showing a cellular phone 10 which is serving as the electronic apparatus according to the present invention. FIGS. 2A and 2B show a relationship between a circuit board 111 inside a first body 11 and a circuit board 121 inside a second body 12 in the cellular phone 10 and a flexible cable 20 (i.e., a connector-fitted cable) used for transmitting signals. FIG. 3 is a cross-sectional view showing the structure of an optical waveguide forming body 21 (i.e., the structure of a cross-section extending in the longitudinal direction of the optical waveguide forming body 21) of the flexible cable 20. FIG. 4 is a cross-sectional perspective view showing the structure of the optical waveguide forming body 21. FIG. 5 is a cross-sectional view showing a state where bending deformation has been applied to a deforming section 21a of the optical waveguide forming body 21.

As is shown in FIG. 1, the cellular phone 10 is a folding type of cellular phone. The cellular phone 10 includes a first body 11, and a second body 12 which is pivotably joined via a hinge portion 13 (i.e., a pivot portion) to the first body 11. In addition, this cellular phone 10 also includes a flexible cable 20 that is used to transmit signals between the first body 11 and the second body 12. The flexible cable 20 is made up of a flexible, belt-shaped optical waveguide forming body 21 manufactured from synthetic resin, and connectors 22 that are attached to both ends in the longitudinal direction of the optical waveguide forming body 21.

In FIG. 1, the symbol 13a is a pivot shaft forming part of the hinge portion 13. The symbols 14 are input operation buttons, and these are provided on the first body 11. In addition, a voice transmitting microphone 15, an antenna 16, and a transmission and reception circuit (not shown) which is connected to the antenna 16 are provided in the first body 11. The transmission and reception circuit is electrically connected to a circuit on a circuit board 111 (see FIGS. 2A and 2B) which is housed in an outer casing 110 of the first body 11. Moreover, a switching circuit which is switched by a pressing of the input operation buttons 14 is also connected to the circuit board 111.

The second body 12 is able to open and close freely relatively to the first body 11 by pivoting around the pivot shaft 13a of the hinge portion 13, and can be pivoted from being closed against the first body 11 to approximately 150 to 180 degrees. The symbol 17 is a display unit which is provided in the second body 12 and which has a display screen which is exposed on the surface of the second body 12 located on the side which is closed against the first body 11. This display unit 17 is electrically connected to a circuit of the circuit board 121 (see FIGS. 2A and 2B) which is housed in an outer casing 120 of the second body 12. A speech output unit 18 (i.e., a speaker) is also provided in the second body 12.

As is shown in FIG. 1, the flexible cable 20 is laid extending from the first body 11 across the length of the second body 12 such that the center portion in the longitudinal direction of the optical waveguide forming body 21 passes adjacent to the hinge portion 13. One end portion in the longitudinal direction of the flexible cable 20 is laid inside the outer casing 110, while the other end portion in the longitudinal direction thereof is laid inside outer casing 120 of the second body 12.

Figure 6:
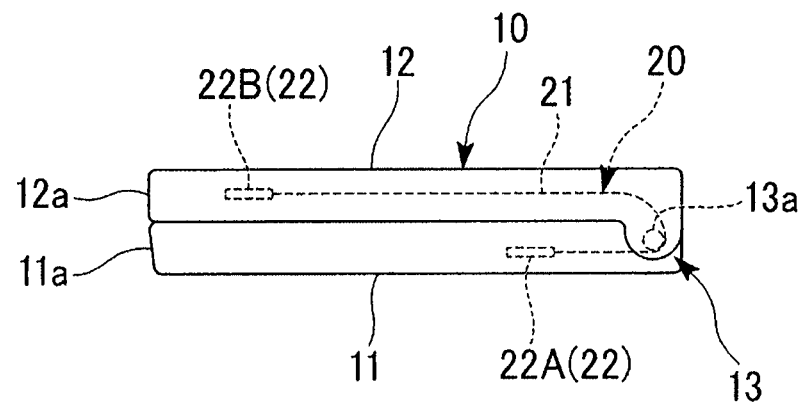
FIG. 6 is a side view showing a state where the second body of the cellular phone shown in FIG. 1 has been shut against the first body.

As is shown in FIG. 6, when the second body 12 is closed against the first body 11, the cellular phone 10 is placed in a state where the first body 11 and the second body 21 both extend from the hinge portion 13 in parallel with each other. The end portion of the first body 11 on the opposite side from the hinge portion 13 is referred to below as a first body extended end portion 11a, while the end portion of the second body 12 on the opposite side from the hinge portion 13 is referred to below as a second body extended end portion 12a. The optical waveguide forming body 21 of the flexible cable 20 is laid such that, when the second body 12 is closed against the first body 11, it passes through the opposite side from the first body extended end portion 11a and second body extended end portion 12a via the pivot shaft 13a of the hinge portion 13. Moreover, the optical waveguide forming body 21 of the flexible cable 20 passes through aperture portions (not shown) formed respectively in the vicinity of the hinge portion 13 of the outer casing 110 of the first body 11 and the vicinity of the hinge portion 13 of the outer casing 120 of the second body 12.

Note that the wiring mode of the optical waveguide forming body 21 of the flexible cable 20 in the vicinity of the hinge portion 13 is not limited to the above described structure. For example, it is also possible to employ a structure where the optical waveguide forming body 21 of the flexible cable 20 passes between a pair of hinge portions which are provided apart from each other.

Note that in this cellular phone 10, in addition to the flexible cable 20 which is used for transmitting optical signals and the like, it is also possible for power supply wires to also be laid between the first body 11 and the second body 12. Furthermore, electrical signal transmission wires may also be laid.

The flexible cable 20 will now be described.

As is shown in FIG. 3 and FIG. 4, the optical waveguide forming body 21 has a plurality (three are shown in FIG. 4) of core portions 21a which extend in the longitudinal direction thereof and which are lined up horizontally inside a cladding portion 21b which has a lower refractive index than that of the core portions 21a.

As is shown in FIGS. 2A and 2B, the optical waveguide forming element 21 is optically connected by means of the connectors 22 located at both ends in the longitudinal direction thereof to an optical element (i.e., a light emitting element 112) which is packaged on the circuit board 111 inside the outer casing 110 of the first body 11, and to an optical element (i.e., a photoreceptor element 122) which is packaged on the circuit board 121 inside the outer casing 120 of the second body 12.

In this cellular phone 10, an optical signal output from the light emitting element 112 provided in the first body 11 can be received via the optical waveguide forming body 21 of the flexible cable 20 by the photoreceptor element 122 provided in the second body 12. Namely, the flexible cable 20 functions as a signal transmission cable that transmits optical signals from the first body 11 to the second body 12.

Accordingly, the optical waveguide forming body 21 is constructed so as to internally house a plurality of optical waveguides that correspond to the respective core portions 21a, and each one of the optical waveguides can be used as a transmission path for transmitting optical signals from the first body 11 to the second body 12.

In FIGS. 2A and 2B, the symbol 22A is used for one of the connectors 22 which are provided at both ends in the longitudinal direction of the flexible cable 20 (i.e., the longitudinal direction of the optical waveguide forming body 21), while the symbol 22B is used for the other connector. In the example shown in the drawings, the connector having the symbol 22A is the connector 22 which is used to optically connect the optical waveguide forming body 21 to the optical element (i.e., the light emitting element 112) provided on the circuit board 111 of the first body 11, while the connector having the symbol 22B is the connector 22 which is used to optically connect the optical waveguide forming body 21 to the optical element (i.e., the photoreceptor element 122) provided on the circuit board 121 of the second body 12.

The connectors 22A and 22B each includes a housing 221 attached to end portions (i.e., end portions in the longitudinal direction) of the optical waveguide forming body 21. These housings 221 internally house mirrors 222 which form reflective surfaces 222a which are tilted at an angle of 45 degrees relative to the optical axis of the optical waveguide paths corresponding to the respective core portions 21a of the optical waveguide forming body 21.

The mirrors 222 are placed within recesses 223 which open onto side surfaces of the housing 221 in the vicinity of end surfaces of the optical waveguide forming body 21 and on an extension of the optical axis at these end surfaces. The reflective surfaces 222a are tilted at an angle of 45 degrees relative to the optical axis at the end surfaces of the optical waveguide forming body 21.

The light emitting element 112 is packaged on the circuit board 111 of the first body 11, and an engaging recess 113 into which is pushed an engaging projection 224 which stands upright from the housing 221 of the connector 22A is formed in the vicinity of the light emitting element 112 as a positioning portion which is used to fix the position of the connector 22A relative to the light emitting element 112. A connector connecting portion which includes an optical element (i.e., the light emitting element 112) and with the engaging recess 113 is provided on the circuit board 111.

As is shown in FIG. 2B, in the connector 22A, by pushing the engaging projection 224 into the engaging recess 113 which is formed in the circuit board 111 of the first body 11, the mirror 222 is positioned on the optical axis of light output from the light emitting element 112 on the circuit board 111, and an optical path 22H1 is formed that optically couples the light emitting element 112 and the optical waveguide path forming body 21 via the mirror 222. As a result of this, output light from the light emitting element 112 can be irradiated via the mirror 222 onto the optical waveguide forming body 21.

In contrast, the photoreceptor element 122 is packaged on the circuit board 121 of the second body 12, and an engaging recess 123 into which is pushed an engaging projection 224 which stands upright from the housing 221 of the connector 22B is formed in the vicinity of the light emitting element 112 as a positioning portion which is used to fix the position of the connector 22B relative to the light emitting element 112. A connector connecting portion which is equipped with an optical element (i.e., the photoreceptor element 122) and the engaging recess 123 is provided on the circuit board 121.

As is shown in FIG. 2B, the connector having the symbol 22B has the same structure as the connector 22A. By pushing the engaging projection 224 which is standing upright from the housing 221 into the engaging recess 123 which is formed in the circuit board 121 of the second body 12, the mirror 222 is positioned on the optical axis of light received by the photoreceptor element 122 which is packaged on the circuit board 121 in the vicinity of the engaging recess 123, and so that an optical path 22H2 is formed that optically couples the photoreceptor element 122 and the optical waveguide path forming body 21 via the mirror 222. As a result of this, transmission light from the optical waveguide forming body 21 can be received on the photoreceptor element 112.

Note that the engaging projections 224 of the connectors 22A and 22B can be removably inserted into the engaging recesses 113 and 123 of the circuit boards 111 and 121.

A structure may be employed where these connectors maintain their mounted state (i.e., their connected state) in the circuit boards 111 and 121 by means of the extraction resistance generated as a result of the internal surfaces of the engaging recesses 113 and 123 pressing against the engaging projections 224 which are press-inserted into the engaging recesses 113 and 123. The engaging projections 224 which are engaged in the engaging recesses 113 and 123 can be extracted from the engaging recesses 113 and 123 by applying force which is greater than this extraction resistance, thereby enabling the connectors to be separated from the circuit boards 111 and 121. However, in order to maintain the stability of the mounted states on the circuit boards, it is more preferable to employ a structure where engaging components such as elastic claws or the like which can be removably mounted on the circuit boards are provided. For example, if a structure is employed where the connectors includes these elastic claws and levers that cause the elastic claws engaged with the circuit board to be displaced (i.e., engagement release levers) and thereby release the engagement with the circuit board, then the efficiency with which the task of connecting or disconnecting a connector relative to the circuit board is performed can be improved.

Moreover, the positioning portions that are provided on the circuit board are not limited to the aforementioned engagement recesses. For example, it is also possible to employ positioning projections or positioning frames and the like that hold the connector housing. The shape of the connectors can also be altered in accordance with the positioning portions on the circuit board side. It is also possible to employ a structure where the connectors are not equipped with engaging projections.

In the cellular phone 10, one end side in the longitudinal direction of the optical waveguide forming body 21 of the flexible cable 20 is optically connected to the light emitting element 112 of the circuit board 111 of the first body 11 by the connector 22A, while the other end side in the longitudinal direction of the optical waveguide forming body 21 is optically connected to the photoreceptor element 122 of the circuit board 121 of the second body 12 by the connector 22B. Namely, the cellular phone 10 has a structure where the light emitting element 112 of the first body 11 and the photoreceptor element 122 of the second body 12 are optically connected via the flexible cable 20.

As has been stated above, the optical waveguide forming body 21 of the flexible cable 20 is laid so as to pass adjacent to the hinge portion 13 (see FIG. 1), and so as to extend from the first body 11 over the length of the second body 12. The optical waveguide forming body 21 has a deforming section 21H which undergoes bending deformation as a result of the pivoting of the second body 12 around the hinge portion 13.

The optical waveguide forming body 21 has an internal air cladding portion 21d that is located in an internal portion of the optical waveguide forming body 21 which corresponds to the deforming section 21H, and that secures air layers 21c which are in contact with the core portions 21a. By means of this structure (i.e., the structure where the internal air cladding portion 21d is provided), the optical waveguide forming body 21 is provided with improved folding endurance against repeated folding of the deforming section 21H as a result of the pivoting of the second body 12 around the hinge portion 13.

As is shown in FIG. 4, the cross-section of the optical waveguide forming body 21 is formed in a flat, belt shape, and the core portions 21a extend linearly for the entire length in the longitudinal direction of the optical waveguide forming body 21 in the center portion in the thickness direction thereof. Furthermore, these core portions 21a are arranged in parallel rows in a plurality (three are shown in FIG. 4) of locations in the width direction of the optical waveguide forming body 21. Note that the number of core portions 21a is not limited to the three shown in FIG. 4, and one, two, or four or more core portions 21a (for example, see FIG. 7F) may also be provided.

The deforming section 21H of the optical waveguide forming body 21 is located in the center portion in the longitudinal direction of the optical waveguide forming body 21, and the internal air cladding layer 21d of the optical waveguide forming body 21 is also located in the center portion in the longitudinal direction of the optical waveguide forming body 21 (see FIG. 3).

As is shown in FIG. 3 and FIG. 4, the internal air cladding layer 21d of the optical waveguide forming body 21 enables the air layers 21c to be secured on both sides of the core portions 21a in the thickness direction of the optical waveguide forming body 21. These air layers 21c also extend in the longitudinal direction of the core portions 21a.

In the internal air cladding portion 21d of the optical waveguide forming body 21, trenches 21e which extend in the longitudinal direction of the core portions 21a are formed in the cladding portion 21b on both sides of the core portions 21a in the thickness direction of the optical waveguide forming body 21. These trenches 21e are formed by hollowing out the cladding portion 21b from the core portion 21a side. By means of these trenches 21e, the air layers 21c which are in contact with the core portions 21a are reliably provided inside the optical waveguide forming body 21. Namely, the interiors of the trenches 21e form the air layers 21c.

Furthermore, as is shown in FIG. 4, the optical waveguide forming body 21 of the present invention is formed as a layered structure that is made up of three resin layers 211, 212, and 213.

The plurality of core portions 21a of the optical waveguide forming body 21 are formed in the resin layer 211 in the center of the three layers (sometimes referred to below as the core layer), and are lined up adjacent to each other in the width direction of the optical waveguide forming body 21. The plurality of core portions 21a are formed separated from each other in a plurality of locations in the core layer 211. Moreover, portions other than the core portions 21a of the core layer 211, and the resin layers 212 and 213 (sometimes referred to below as cladding layers) which are provided in layers on both sides of the core layer 211 form the cladding portion 21b have a lower refractive index than core portions 21a.

The trenches 21e in the cladding portion 21b are formed in locations in the cladding layers 212 and 213 on both sides of the core layer 211 so as to face the core portions 21a and so as to extend in the longitudinal direction of the core portions 21a. Accordingly, in the internal air cladding portion 21d, the air layers 21c are reliably secured between the cladding layers 212 and 213 and the core portions 21a by means of the trenches 21e.

Note that examples of a method and of materials used to manufacture an optical waveguide forming body which is made up of three resin layers are described below.

The range over which the internal air cladding portion 21d is formed in the longitudinal direction of the optical waveguide forming body 21 (i.e., the distance for which the internal air cladding portion 21d extends) is preferably greater than the range of the deforming section 21H. As is shown in FIG. 5, in this embodiment, the range over which the internal air cladding portion 21d is formed in the longitudinal direction of the optical waveguide forming body 21 (i.e., the distance for which the internal air cladding portion 21d extends) includes the portion of the flexible cable 20 that corresponds to the deforming section 21H, and is made greater than the deforming section 21H so as to have portions that extend beyond the range that corresponds to the deforming section 21H on both sides in the longitudinal direction of the optical waveguide forming body 21. Note that the two sides of the internal air cladding portion 21d in the longitudinal direction of the optical waveguide forming body 21 form a solid portion 21f (see FIG. 3 and FIG. 5) where the air layers 21c are not formed.

The optical waveguide forming body 21 of the flexible cable 20 is formed in a rectilinear shape, and when the second body 12 of the cellular phone 10 is opened approximately 180 degrees from the first body 11, it is in a state where substantially (or absolutely) no bending deformation is applied to the deforming section 21H. In contrast, if the second body 12 is closed against the first body 11, the portion of the flexible cable 20 that is located adjacent to the hinge portion 13, namely, the deforming section 21H undergoes bending deformation.

Namely, as is shown in FIG. 5, in the cellular phone 10, as a result of the pivoting of the second body 21 relatively to the first body 11, bending deformation is applied to the deforming section 21H of the optical waveguide forming body 21 such that one side of the optical waveguide forming body in the thickness direction thereof is bent onto the inner circumferential side, and the other side thereof is bent onto the outer circumferential side (this will sometimes be referred to below as vertical bending).

As is shown in FIG. 5, when bending deformation is applied to the deforming section 21H of the optical waveguide forming body 21, one of the air layers 21c (referred to below as a first air layer and allocated the symbol 21c1 in FIG. 3, FIG. 4, and FIG. 5) that are secured on both sides of the core portions 21a in the internal air cladding portion 21d of the optical waveguide forming body 21 forms the outer circumferential side of the core portions 21a, while the other of the air layers 21c (referred to below as a second air layer and allocated the symbol 21c2 in FIG. 3, FIG. 4, and FIG. 5) forms the inner circumferential side of the core portions 21a.

In the optical waveguide forming body 21 of the flexible cable 20, of the air layers 21c1 and 21c2 that are secured on both sides of the core portions 21a of the optical waveguide forming body, the first air layer 21c1 which is positioned on the outer circumferential side of the core portions 21a when bending deformation is applied to the deforming section 21H is particularly effective in contributing to maintaining the optical transmission characteristics of the core portions 21a and to improving the folding endurance of the optical waveguide forming body 21.

As is shown in FIG. 5, when bending deformation is applied to the deforming section 21H of the optical waveguide forming body 21, tensile stress acts on the outer circumferential side of the bending of the optical waveguide forming body 21. Because of this, displacement force that attempts to move towards the bending inner circumferential side acts on the portions of the cladding portion 21b of the optical waveguide forming body 21 which are located further to the bending outer circumferential side than the core portions 21a.

If the air layers 21c of the internal air cladding portion 21d are omitted and a solid structure the same as the solid portion 21f is formed, then when bending deformation (i.e., vertical bending) is applied, the core portions 21a become pressed by the displacement force generated by the portions of the cladding portion 21b which are located further on the bending outer circumferential side than the core portions 21a attempting to move towards the bending inner circumferential side.

In contrast to this, in the optical waveguide forming body 21 of the flexible cable of the present invention, when bending deformation (i.e., vertical bending) is applied to the deforming section 21H, as a result of the first air layers 21c1, the portions of the cladding portion 21b that are located on the opposite side of the first air layers 21c1 from the core portions 21a (referred to below on occasion as outer circumferential side thin portions 21b1) can lessen or eliminate the pressing force applied to the core portions 21a by the displacement force towards the inner circumferential side of the bending. When bending deformation is applied to the deforming section 21H, the outer circumferential side thin portions 21b1 of the cladding portion 21b do not make contact with the core portions 21b, and it is possible to prevent pressing force being applied to the core portions 21a. Moreover, even if the outer circumferential side thin portions 21b1 of the cladding portion 21b do come into contact with the core portions 21a, compared with a solid structure which is not provided with the air layers 21c, it is possible to restrict the pressing force applied to the core portions 21a to a low level. Because of this, even if bending deformation is repeatedly applied to the deforming section 21H, it is difficult for distortion and fractures and the like which may cause optical loss in the optical waveguide forming body 21 to increase to be generated. Consequently, this is beneficial in maintaining stability in the optical characteristics of the core portions 21a. Moreover, because the outer circumferential side thin portions 21b1 of the cladding portion 21b are able to be displaced due to the existence of the first air layers 21c1, when bending deformation is applied to the deforming section 21H, it is difficult for localized stress concentration to be generated in the optical waveguide forming body 21 and the folding endurance of the optical waveguide forming body 21 is improved.

Moreover, in the internal air cladding portion 21d includes the air layers 21c which are in contact with both sides of the core portions 21a (i.e., with the inner circumferential side and outer circumferential side thereof when the deforming section 21H undergoes bending deformation), it is possible to make it even more difficult to generate localized stress concentration in the optical waveguide forming body 21 when bending deformation is applied to the deforming section 21H than it would be in an internal air cladding portion 21d including air layers 21c that are only in contact with one side of the core portions 21a (i.e., with either the inner circumferential side or the outer circumferential side thereof when the deforming section 21H undergoes bending deformation). Accordingly, the above described structure effectively contributes to improving the folding endurance of the optical waveguide forming body 21.

Furthermore, in the internal air cladding portion 21d, when bending deformation is applied to the deforming section 21H, due to the existence of the air layers 21c1 and 21c2 on both sides of the core portions 21a, it is possible to secure a large degree of deformation freedom in portions of the cladding portion 21b located on both sides of the core portions 21a in the thickness direction of the optical waveguide forming body 21. Because of this, it becomes difficult for damage caused by bending deformation to occur in the cladding portion 21b. As a result, it is possible to secure a high level of mechanical endurance in the internal air cladding portion 21d. This is also effective in contributing to improving the folding endurance of the optical waveguide forming body 21 and the core portions 21a.

In the internal air cladding portion 21d of the optical waveguide forming body 21, the thickness of the cladding portion 21b on both sides of the core portions 21a is made thinner by the presence of the air layers 21c1 and 21c2 on both sides of the core portions 21a. Because of this, the internal air cladding portion 21d more easily experiences bending deformation than the solid portions 21f, and the bend radius can be reduced.

Even if the second air layers 21c2 are not formed and only the first air layers 21c1 are formed, it is possible to reduce the bend radius compared to the solid portions 21f. Moreover, because the first air layers 21c1 contribute more effectively to improving the folding endurance than the second air layers 21c2, even if a structure is employed where the second air layers 21c2 are omitted, it is still possible to easily achieve an improvement in the folding endurance from the first air layers 21c1.

Furthermore, in the internal air cladding portion 21d, because the air layers 21c can themselves be made to function as cladding portions (i.e., air cladding), it is possible to secure a superior light confinement effect in the optical waveguide forming body 21. Even when bending deformation has been applied to the bending section 21H of the optical waveguide forming body 21, the air layers 21c contribute to the light confinement effect and any increase in bending loss can be suppressed.

(Method of Manufacturing an Optical Waveguide Forming Body)

Next, an example of a method of manufacturing an optical waveguide forming body which is made up of three resin layers will be described.

Figure 7A:
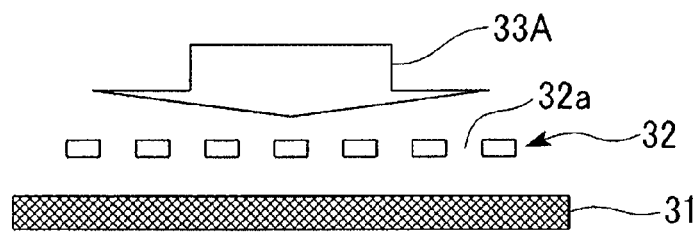
FIG. 7A is a view illustrating an example of the method of manufacturing the optical waveguide forming body shown in FIG. 3.
Figure 7B:
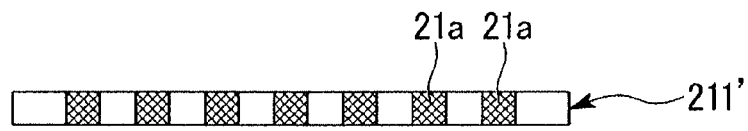
FIG. 7B is a view illustrating an example of the method of manufacturing the optical waveguide forming body shown in FIG. 3.
Figure 7C:
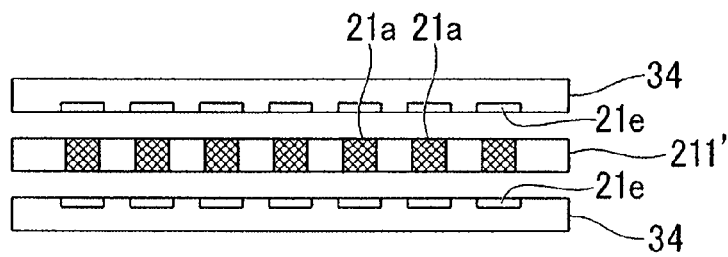
FIG. 7C is a view illustrating an example of the method of manufacturing the optical waveguide forming body shown in FIG. 3.
Figure 7D:
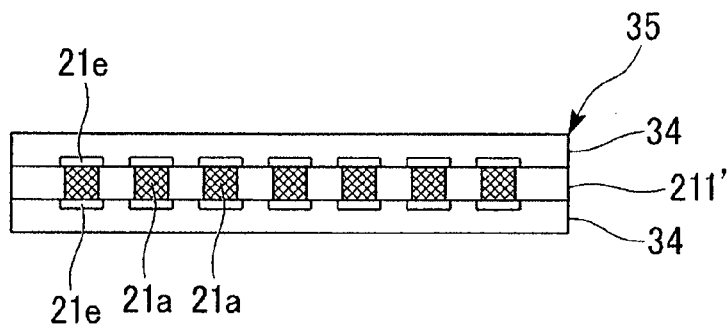
FIG. 7D is a view illustrating an example of the method of manufacturing the optical waveguide forming body shown in FIG. 3.
Figure 7E:
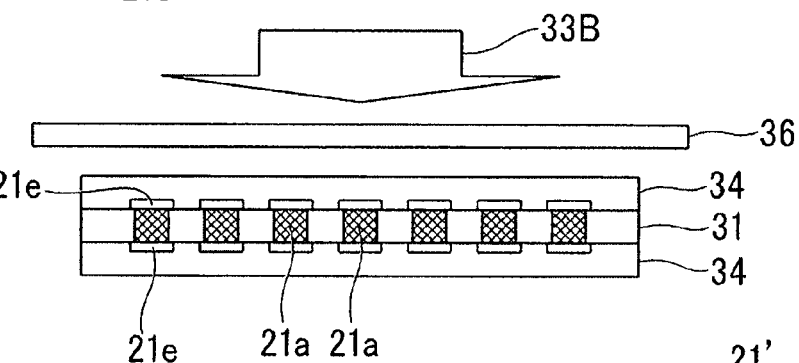
FIG. 7E is a view illustrating an example of the method of manufacturing the optical waveguide forming body shown in FIG. 3.
Figure 7F:
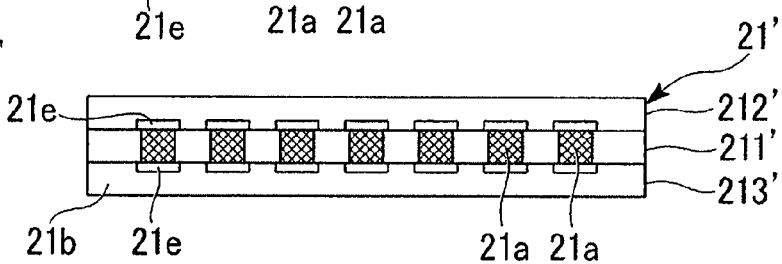
FIG. 7F is a view illustrating an example of the method of manufacturing the optical waveguide forming body shown in FIG. 3.

FIGS. 7A to 7F are views illustrating an example of a method of manufacturing an optical waveguide forming body will be described. Here, a case where an optical waveguide forming body 21' shown in FIG. 7F is manufactured will be described. The optical waveguide forming body 21' shown in FIG. 7F differs from the optical waveguide forming body 21 illustrated in FIG. 4 in that it has a greater number of core portions 21a.

The method of manufacturing an optical waveguide forming body described here is applied to the manufacturing of an optical waveguide forming body which is made up of three resin layers in the form of a core layer interposed between two cladding layers. This method can also be applied in the same way to the manufacturing of the optical waveguide forming body 21 illustrated in FIG. 4 which is made up of the three resin layers 211, 212, and 213. In addition, the materials described below can also be used in the same way.

In FIG. 7F, the symbol 211' is the core layer, and the symbols 212' and 213' are the cladding layers.

In the method of manufacturing the optical waveguide forming body 21' described here, firstly, as is shown in FIGS. 7A and 7B, the core layer 211' of the optical waveguide forming body 21' is obtained (core layer formation step).

In this core layer formation step, firstly, a core layer formation film material 31 (i.e., a core layer layered body—see FIG. 7A) which is obtained by molding the material used to form the core layer 211' (i.e., a core layer formation material) into a film shape is prepared.

In the manufacturing method described here, the core layer formation material contains a polymer having a main chain and a leaving group which branches off this main chain as its primary constituent, and also contains a first photo-acid generator which is activated by the irradiation thereon of ultraviolet light so as to generate acid.

As the core layer formation film material 31 it is possible to use, for example, a dry coated film obtained by coating onto a component such as a resin film (i.e., a varnish coating component) a varnish which has been created by dissolving core layer formation materials such as the aforementioned polymer and first photo-acid generator in a solvent (for example, mesitylene or the like), and then drying this varnish. This dry coated film is used after being removed from the varnish coating component.

The first photo-acid generator has an absorption maximum wavelength in the ultraviolet region. The polymer of the core layer formation film material 31 is a polymer whose refractive index is changed as a result of the leaving group leaving (i.e., being cut from) the main chain due to the action of acid (preferably proton) discharged by the activated first photo-acid generator after the irradiation thereon of ultraviolet light. The leaving of the polymer by the leaving group is advanced by the irradiation of ultraviolet light and by the resulting heating. In addition, the core layer formation film material 31 is cured by this heating.

Note that in this method of manufacturing an optical waveguide forming body, an example is described where the material that is employed for the core layer formation film material 31 is one where the refractive index of irradiated areas is reduced by the irradiation thereon of ultraviolet light and by the resulting heating.

In this core layer formation step, ultraviolet light having a wavelength which includes the absorption maximum wavelength of the first photo-acid generator (this is referred to below as first ultraviolet light and is allocated the symbol 33A) is irradiated onto a portion of the core layer formation film material 31 (see FIG. 7A) by using, for example, a photomask 32 (see FIG. 7A). After that, by then heating the core layer formation film material 31, as is shown in FIG. 7B, the core layer 211' is obtained. Because the core layer 211' obtained here has a film shape, this is referred to below on occasion as a core film.

The photomask 32 which is used here is one which has apertures 32a that correspond to the areas of the cladding portion 21b of the core layer 211' to be obtained. As a result of this, in the core layer formation film material 31, the refractive index of the irradiated areas onto which the first ultraviolet light 33A has been irradiated is lower than the refractive index of the non-irradiated areas where the first ultraviolet light 33A has not been irradiated, and a core film 211' which is a single layer optical waveguide which uses the non-irradiated areas for the core portions 21a is obtained. Namely, by irradiating the first ultraviolet light 33A via the photomask 32 onto the core layer formation film material 31, it is possible to pattern the core portion.

As the core layer formation film material 31, it is also possible to use a material where the refractive index of irradiated areas is raised by the irradiation thereon of the first ultraviolet light 33A. In this case, the photomask which is used is one which has apertures that correspond to the areas of the core portions 21a of the core layer 211' which is to be obtained. As a result of this, the irradiated areas where ultraviolet light was irradiated formed the core portions 21a.

Next, as is shown in FIG. 7C, a cladding layer formation film material 34 which has been prepared in advance is thermocompression-bonded onto both surfaces of the core film 211', and a material laminated body 35 (see FIG. 7D) that is formed by the core film 211' and the cladding layer formation film material 34 is obtained (thermocompression bonding step).

The cladding layer formation material 34 is obtained by molding the material which is to be used to form the cladding layers 212' and 213' (i.e., the cladding layer formation material) into a film shape, and then forming the trenches 21e which are used to secure the air layers 21c (i.e., the air cladding) in the optical waveguide forming body 21 on one side thereof.

It is preferable that the depth of the trenches 21e is between ⅓ and ½ the thickness of the cladding formation film material 34, and the width (i.e., the trench width) thereof is 2 to 3 times the width of the core portions 21a (i.e., the width of the core portions 21a when the core layer is viewed in plan view. If the core portions 21a have a square cross-section, then the width is to be the length of one side of that cross-section). Furthermore, in order to obtain the desired operational effect from an optical waveguide forming body, namely, flexibility, folding endurance, and the suppression of any loss increase (i.e., the maintenance of a low loss level) when bending deformation is applied thereto, it is preferable that also in a manufactured optical waveguide forming body the depth of the trenches 21e is between ⅓ and ½ the thickness of the cladding layer, and the width thereof is 2 to 3 times the width of the core portions 21a.

Form the standpoint of guaranteeing accuracy and the like, it is preferable that the trenches 21e is formed, for example, by irradiating a laser (it is preferable, for example, for an excimer laser to be used) onto the cladding layer formation material which has been molded into a film shape. However, the method that is used to form a cladding layer formation film material 34 having trenches is not limited to this. For example, it is also possible to form the trenches using mechanical processing such as by cutting a cladding layer formation material which has been molded into a film shape, or by forming trenches in the desired positions using a pattern etching method. Moreover, it is also possible to employ a method where, when a varnish containing a cladding layer formation material is coated onto a resin film or the like so that a dry coating film is obtained, molding components that have protruding portions in order to form trenches are used so that a cladding layer formation film material 34 having trenches is obtained. Furthermore, it is also possible to employ a method where a cladding layer formation film material 34 having trenches is obtained by impressing a hot plate having protruding portions that are used to form trenches onto a cladding layer formation material that has been molded into a film shape.

In the manufacturing method described here, the cladding layer formation material contains a polymer having a polymeric group as its primary constituent, and also contains a second photo-acid generator which has an absorption maximum wavelength that is different from that of the first photo-acid generator and which is activated by the irradiation thereon of ultraviolet light so as to generate acid.

As the cladding layer formation film material 34 it is possible to use, for example, a dry coated film obtained by coating onto a component such as a resin film (i.e., a varnish coating component) a varnish which has been created by dissolving core layer formation materials such as the aforementioned polymer and second photo-acid generator in a solvent (for example, anhydrous toluene or the like), and then drying this varnish. This dry coated film is used after being removed from the varnish coating component.

The second photo-acid generator also has an absorption maximum wavelength in the ultraviolet region in the same way as the first photo-acid generating agent.

The polymer of the cladding layer formation film material 34 is a polymer where the polymeric group performs a cross-linking reaction due to the action of an acid (preferably a proton) discharged by the activated second photo-acid generator after the irradiation thereon of ultraviolet light.

The acid that is discharged by the irradiation of the second photo-acid generator is one that is intended to generate a cross-linking reaction in the polymeric group of the polymer of the cladding layer formation film material 34.

The thermocompression bonding is performed by heating the core film 211' and the cladding layer formation film material 34 while the cladding layer formation film material 34 is in contact with the core film 211'. The heating temperature is set by observing the glass transition temperature Tg of the core film 211' and the glass transition temperature Tg of the cladding layer formation film material 34, and then setting the heating temperature to equal to or greater than the lower of these glass transition temperatures Tg. By doing this, the core film 211' and/or the cladding layer formation film material 34 are heated to a temperature equal to or greater than the glass transition temperature, and consequently melted. Pressure is then applied so as to achieve thermocompression bonding.

Next, as is shown in FIG. 7E, using, for example, a wavelength cutoff filter 36, ultraviolet light that contains the absorption maximum wavelength of the second photo-acid generator but does not contain the absorption maximum wavelength of the first photo-acid generator (hereinafter, this is referred to as second ultraviolet light and is allocated the symbol 33B) is irradiated onto the entire surface of the material laminated body 35. After this, the material laminated body 35 is heated, and the cladding layer formation film material 34 is cured (cladding formation step). The cured cladding layer formation film material 34 forms the cladding layers 212' and 213' whose refractive index is lower than that of the core portions 21a of the core film 211'.

In the cladding layer formation film material 34, the cross-linking of the polymeric group (i.e., cationic polymerization) is advanced (in other words, the curing and the transition to a cladding layer is advanced) by the irradiation of the ultraviolet light and the subsequent heating, and the cladding layer formation film material 34 is cured so as to form a cladding layer (cladding formation). In conjunction with the curing of the cladding layer film formation material 34, there is also an improvement in the tightness of the adhesion between the core layer 211' and the cladding layer formation film material 34. The heating time of the heating performed after the irradiation of the second ultraviolet light is set so as to ensure that the cladding formation (i.e., the cross-linking reaction) of the cladding layer formation film material 34 progresses satisfactorily and then stops.

By performing this step, the optical waveguide forming body 21' which is a three-layer optical waveguide made up of the core layer 211' and the cladding layers 212' and 213' on both sides thereof is obtained (FIG. 7F).

As has been stated above, the second photo-acid generator of the cladding layer formation film material is activated by the irradiation thereon of ultraviolet light having a different absorption maximum wavelength from that of the first photo-acid generator so as to generate acid. In the cladding formation step, the second ultraviolet light 33B which contains the absorption maximum wavelength of the second photo-acid generator but does not contain the absorption maximum wavelength of the first photo-acid generator is irradiated onto the material laminated body 35. As a result, the first photo-acid generator of the core film 211' is essentially not sensitized by the second ultraviolet light 33B and essentially only the second photo-acid generator is sensitized.

The wavelength cutoff filter 36 which is used in the cladding formation step occludes light having a stipulated wavelength as well as light having a wavelength shorter than the stipulated wavelength, and only transmits light having a wavelength longer than the stipulated wavelength. When this type of wavelength cutoff filter 36 is used, it is essential that the absorption maximum wavelength of the first photo-acid generator is shorter than the absorption maximum wavelength of the second photo-acid generator.

Figure 8:
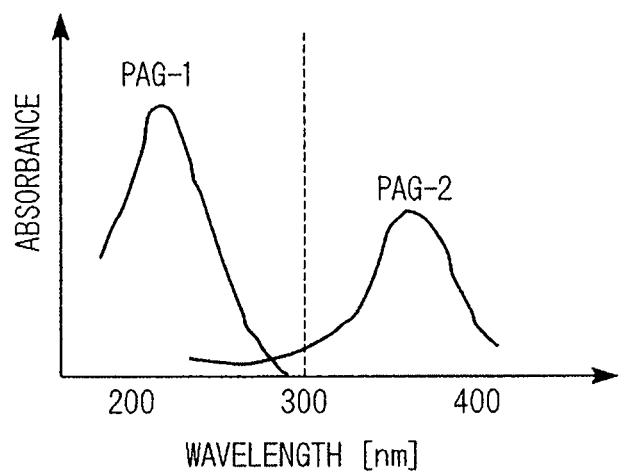
FIG. 8 is a view showing an example of the photo-absorption characteristics of a first photo-acid generator and a second photo-acid generator used in the manufacturing method illustrated in FIG. 7, and illustrates cases where a photo-acid generator having an absorption maximum wavelength in the range of 150 nm to 300 nm is selected for the first photo-acid generator, and a photo-acid generator having an absorption maximum wavelength in the vicinity of 365 nm (I-rays) is selected for the second photo-acid generator.

For example, if a wavelength cutoff filter 36 is used which occludes light whose wavelength is 300 nm or less and only transmits light having a wavelength longer than 300 nm, then as is shown in FIG. 8, a photo-acid generator (PAG-1 in FIG. 8) whose absorption maximum wavelength is 300 nm or less is selected for the first photo-acid generator, and a photo-acid generator (PAG-2 in FIG. 8) whose absorption maximum wavelength is greater than 300 nm is selected for the second photo-acid generator. In this case, for example, it is preferable that a photo acid generator whose absorption maximum wavelength is 300 nm or less (for example, whose absorption maximum wavelength is within a range of 150 nm to 300 nm) is used for the first photo-acid generator, and that a photo-acid generator whose absorption maximum wavelength is in the vicinity of 365 nm (I-rays) is used for the second photo-acid generator.

Note that the term 'absorption maximum wavelength' is the wavelength where the peak value of the absorbance is obtained (i.e., the maximum absorption wavelength), for example, in the PAG-1 curve and the PAG-2 curve in FIG. 8.

As is described above, if the absorption maximum wavelength of the first photo-acid generator and the absorption maximum wavelength of the second photo-acid generator are mutually discorded, then the first photo-acid generator is essentially not sensitized when the second ultraviolet light is irradiated onto the entire surface of the material laminated body 35 during the cladding formation step. Because of this, acid does not become generated from the first photo-acid generator which is remaining on the core portions 21a of the core layer 211', and the refractive index difference generated during the formation of the core layer 211' does not become reduced or eliminated. Namely, the optical waveguide structure of the core layer is not damaged by the irradiation of the second ultraviolet light over the entire surface of the material laminated body.

Moreover, in the thermocompression bonding of the cladding formation film material onto the core layer 211', the glass transition temperature Tg prior to the irradiation of the second ultraviolet light is lower compared to after the irradiation of the second ultraviolet light. because of this, if the thermocompression bonding is performed prior to the irradiation of the second ultraviolet light onto the cladding formation film material, it is possible to keep the heating temperature and pressure required for the thermocompression bonding at a low level. Namely, it is possible that the thermocompression bonding is performed at a temperature in the vicinity of the glass transition temperature Tg of the cladding formation film material.

Moreover, by performing the thermocompression bonding step, in the subsequent cladding formation step, even if the heating which is performed after the irradiation of the second ultraviolet light is carried out via batch processing using oven heating without any pressure being applied, it is still possible to satisfactorily increase the tightness of the adhesion between the core layer 211' and the cladding layer formation film material 34. Performing the heating in the cladding formation step via batch processing is preferable in that it becomes possible to simultaneously process a plurality of material laminated bodies and thereby improve productivity.

Figure 9:
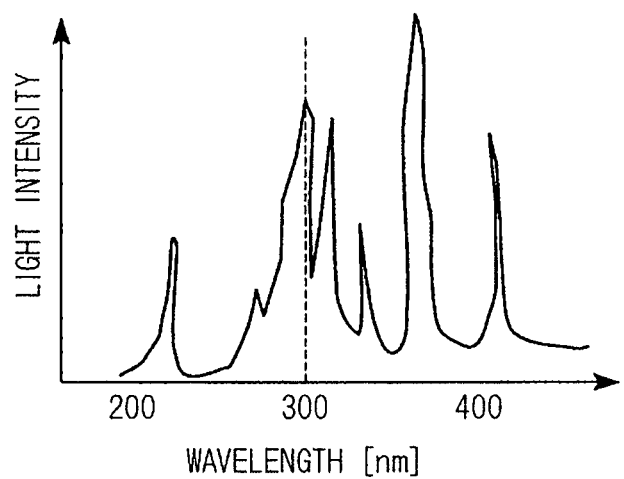
FIG. 9 is a view showing the spectral distribution of output light from a high-pressure mercury lamp (or from a metal halide lamp).

For the irradiation apparatuses used to irradiate the first ultraviolet light and second ultraviolet light, for example, high-pressure mercury lamps or metal halide lamps or the like can be favorably used. The wavelength range of output light from irradiation apparatuses such as high-pressure mercury lamps and metal halide lamps is broad and, as is shown in FIG. 9, is within a range of approximately ±100 nm on either side of a wavelength of 300 nm. In particular, irradiation apparatuses that can ensure a sufficient output light intensity in the vicinities of 220 nm, 300 nm, and 365 nm are suggested. If ultraviolet light output from an irradiation apparatus is to be irradiated onto the material laminated body 35 via a wavelength cutoff filter, then it is possible to easily and reliably remove light having the absorption maximum wavelength of the first photo-acid generator from the output light from an irradiation apparatus such as a high-pressure mercury lamp or a metal halide lamp.

Note that the present invention is not limited to an embodiment where a wavelength cutoff filter is used. There may also be cases where the absorption maximum wavelength of the first photo-acid generator is longer than the absorption maximum wavelength of the second photo-acid generator.

As the leaving group of the component polymer of the core layer formation film material 31 which is used to form the core layer 21a, it is preferable that at least one of an -O-structure, a -Si-aryl structure, and an -O-Si-structure is present in the molecular structure thereof. These leaving groups are able to leave comparatively easy due to cationic action. Of these, at least one of a -Si-diphenyl structure and an -O-Si-diphenyl structure is preferable as the leaving group that causes a reduction to occur in the refractive index of the polymer as a result of the leaving.

Examples of this type of polymer include cyclic olefin resins such as norbornene resins and benzocyclobutene resins, acrylic resins, methacrylic resins, polycarbonate, polystyrene, epoxy resins, polyamide, polyimide, polybenzoxazole and the like, and combinations of one or two or more of these may be used (for example, polymer alloys, polymer blends (i.e., compounds), copolymers, and the like).

Among these, using norbornene resins (i.e. norbornene-based polymers) as the primary component is particularly preferable. By using a norbornene-based polymer for the polymer a core layer which has superior photo-transmissivity, flexibility, and thermo-resistance can be obtained. Moreover, because a norbornene-based polymer has high hydrophobicity, a core layer that is resistant to dimensional changes caused by moisture absorption and the like can be obtained.

The norbornene-based polymer may either be one that has an individual repeating unit (i.e., a homopolymer), or one that has two or more norbornene-based repeating units (i.e., a copolymer). Examples of this type of norbornene-based polymer include: (1) Addition (co)polymers of norbornene monomers obtained by the addition (co)polymerization of a norbornene monomer; (2) Addition copolymers of norbornene monomers and ethylene or α-olefins; (3) Addition copolymers such as addition copolymers of norbornene monomers and non-conjugated dienes, and addition copolymers of norbornene monomers, non-conjugated dienes, and other monomers; (4) Ring-opening (co)polymers of norbornene monomers and resins obtained by the addition of hydrogen to these (co)polymers; (5) Ring-opening copolymers of norbornene monomers and ethylene or α-olefins, and also resins obtained by adding hydrogen to (co)polymers of these; (6) Ring-opening copolymers of norbornene monomers and non-conjugated dienes or norbornene monomers and non-conjugated dienes together with other monomers, and also ring-opening polymers such as polymers obtained by adding hydrogen to (co)polymers of these.

Examples of the aforementioned polymers include random copolymers, block copolymers, and alternating copolymers and the like.

Among these, it is particularly beneficial to employ an addition polymer of a norbornene polymer in that this enables a core layer having superior transparency, non-conductivity, flexibility, and heat-resistance to be obtained. Moreover, an addition polymer of a norbornene polymer has the further advantage that the refractive index can be adjusted depending on the type of side chain of the addition polymer of the norbornene polymer.

As the polymer whose refractive index is reduced as a result of the leaving by the leaving group, diphenylmethyl norbornene methoxysilane homopolymers and copolymers of hexylnorbornene and diphenylmethyl norbornene methoxysilane can be preferably used.

Examples of the first photo-acid generator include, in addition to tetrakis (pentafluorophenyl) borate and hexafluoroantimonate, tetrakis (pentafluorophenyl) gallate, aluminates, antimonates, other borates, gallates, carboranes, halocarboranes, and the like.

Commercially available product examples of these co-catalysts include: "RHODORSIL (registered trademark—the same applies below) PHOTOINITIATOR 2074 (CAS No. 178233-72-2)" obtainable from Rhodia USA Co. of Cranbury, N.J.; "TAG-372R ((dimethyl(2-(2-naphthyl)-2-oxoethyl) sulfonium tetrakis (pentafluorophenyl) borate: CAS No. 193957-54-9))" obtainable from Toyo Ink Mfg. Co., Ltd. of Tokyo, Japan; "MPI-103 (CAS No. 87709-41-9)" obtainable from Midori Kagaku Co., Ltd. of Tokyo, Japan; "TAG-371 CAS No. 193957-53-8))" obtainable from Toyo Ink Mfg. Co., Ltd. of Tokyo, Japan; "TTBPS-TPFPB (tris(4-tert-butylphenyl) sulfonium tetrakis (pentapentafluorophenyl) borate)" obtainable from Toyo Gosei Co., Ltd. of Tokyo, Japan; and "NAI-105 (CAS No. 85342-62-7)" obtainable from Midori Kagaku Co., Ltd. of Tokyo, Japan.

Examples of the constituent material used for the cladding layer formation film material 34 include cyclic olefin-based resins and the like such as acrylic resins, methacrylic resins, polycarbonates, polystyrenes, epoxy resins, polyamides, polyimides, polybenzoxazoles, benzocyclobutene-based resins, and norbornene-based resins. Either one or combinations of two or more of these may be used (for example, polymer alloys, polymer blends (i.e., compounds), copolymers (i.e., laminated bodies, and the like).

Among these, it is particularly preferable in view of their superior heat resistance that cyclic olefin-based resins such as epoxy resins, polyimides, polybenzoxazoles, benzocyclobutene-based resins, and norbornene-based resins and the like or else resins that contain these as their primary constituent are used. Those that contain norbornene-based resins (i.e., norbornene-based polymers) as their primary constituent are particularly preferable.

Using norbornene-based polymers as the constituent material of the cladding layers 212' and 213' is beneficial in that it enables cladding layers 212' and 213' that have superior transparency, non-conductivity, flexibility, and heat-resistance to be obtained. In addition, because of the hydrophobicity of norbornene-based polymers, it is possible to obtain cladding layers that are resistant to dimensional changes caused by moisture absorption and the like. Moreover, norbornene-based polymers or the raw material thereof, namely, norbornene-based monomers are preferable in that they are comparatively low in cost and are also easy to obtain.

Furthermore, if a material containing a norbornene-based polymer as its primary constituent is used for the material of the cladding layers 212' and 213', then it is possible to obtain cladding layers 212' and 213' that have superior resistance to deformation such as bending and the like. As a result of this, even if bending deformation occurs repeatedly, it is difficult for inter-layer peeling to occur between the cladding layers 212' and 213' and the core layer 211', and microcracks are prevented from being created inside the cladding layers 212' and 213'.

If a material containing a norbornene-based polymer as its primary constituent is used for the material of the core layer 211' as well, then because the materials are the same, the cladding layers are provided with an even greater degree of adhesion with the core layer 211'. As a result of this, inter-layer peeling between the cladding layers 212' and 213' and the core layer 211' can be prevented. Accordingly, because of reasons such as this, the optical transmission performance of the optical waveguide forming body is maintained, and an optical waveguide forming body having superior durability is obtained.

Examples of this type of norbornene-based polymer include: (1) Addition (co)polymers of norbornene monomers obtained by the addition (co)polymerization of a norbornene monomer; (2) Addition copolymers of norbornene monomers and ethylene or α-olefins; (3) Addition copolymers such as addition copolymers of norbornene monomers and non-conjugated dienes, and addition copolymers of norbornene monomers, non-conjugated dienes, and other monomers; (4) Ring-opening (co)polymers of norbornene monomers and resins obtained by the addition of hydrogen to these (co) polymers; (5) Ring-opening copolymers of norbornene monomers and ethylene or α-olefins, and also resins obtained by adding hydrogen to (co)polymers of these; (6) Ring-opening copolymers of norbornene monomers and non-conjugated dienes or norbornene monomers and non-conjugated dienes together with other monomers, and also ring-opening polymers such as polymers obtained by adding hydrogen to (co)polymers of these.

Examples of the aforementioned polymers include random copolymers, block copolymers, and alternating copolymers and the like.

Among these, it is particularly beneficial to employ an addition (co)polymer in that this enables cladding layers 212' and 213' having superior transparency, non-conductivity, flexibility, and heat-resistance to be obtained.

Examples of the polymeric group of the constituent polymer of the cladding layer formation film material 34 include a methacrylic group, an epoxy group, an alkoxysilyl group, and the like. A norbornene-based polymer that includes repeating units of norbornene having a replacement group that includes one of the above described polymeric groups is particularly preferable. By including a repeating unit of norbornene having a replacement group that includes a polymeric group, it is possible to cross-link together either directly or via a cross-linking agent the polymeric groups of at least a portion of the norbornene-based polymer in the cladding layers 212' and 213'.

Moreover, depending on the type of polymeric group, the type of cross-linking agent, the type of polymer used in the core layer 211' and the like, it is possible to cross-link the norbornene-based polymer with the polymer used in the core layer 211'. In other words, it is preferable for at least a portion of these norbornene-based polymers to be cross-linked in a polymeric group. As a result of this, it is possible to achieve an even greater improvement in the actual strength of the cladding layers 212' and 213' themselves and also in the adhesion between the cladding layers 212' and 213' and the core layer 211'.

Examples of the second photo-acid generator include, in addition to tetrakis (pentafluorophenyl) borate and hexafluoroantimonate, tetrakis (pentafluorophenyl) gallate, aluminates, antimonates, other borates, gallates, carboranes, halocarboranes, and the like.

Commercially available product examples of these co-catalysts include "TAG-382" obtainable from Toyo Ink Mfg. Co., Ltd. of Tokyo, Japan and "NAI-105 (CAS No. 8542-62-7)" obtainable from Midori Kagaku Co., Ltd. of Tokyo, Japan.

The optical waveguide forming body of the present invention is not limited to being manufactured using the above described manufacturing method. There are no particular limitations on the method used to manufacture this optical waveguide forming body.

In the above described manufacturing method which is provided with a core layer formation step, a thermocompression bonding step, and a cladding formation step (also referred to below as a post-irradiation method), it is essential for the absorption maximum wavelengths of the photo-acid generators (i.e., the first photo-acid generator and the second photo-acid generator) contained in the core layer formation material and the cladding layer formation material to be mutually different. However, it is also possible to obtain an optical waveguide forming body by performing thermocompression bonding on a film-shaped material used for the cladding (where trenches have already been formed) which has been formed into a film shape using, for example, a cladding layer formation material that does not contain a photo-acid generator.

In this case, as the core layer formation material, it is possible to use a resin composition that uses a cyclic olefin-based resin as its primary material, and whose refractive index is changed by the irradiation thereon of active energy light rays or electron beams, and by the additional application thereto of heat. Namely, the method used to change the refractive index is not limited to the irradiation of ultraviolet light. Note that if electron rays are irradiated, they can be irradiated in a quantity of, for example, 50 to 2000 KGy.

As this type of core layer formation material, it is preferable to use a resin composition that uses as its primary material a cyclic olefin-based resin such as a benzocyclobutene-based resin or a norbornene-based resin, and it is particularly preferable to use a resin composition that uses an addition polymer of a norbornene-based resin as its primary material. Examples of this type of norbornene-based resin include various types of norbornene resins such as: (1) Addition (co) polymers of norbornene monomers obtained by the addition (co)polymerization of a norbornene monomer; (2) Addition copolymers of norbornene monomers and ethylene or α-olefins; (3) Addition copolymers such as addition copolymers of norbornene monomers and non-conjugated dienes, and addition copolymers of norbornene monomers, non-conjugated dienes, and other monomers; (4) Ring-opening (co)polymers of norbornene monomers and resins obtained by the addition of hydrogen to these (co)polymers; (5) Ring-opening copolymers of norbornene monomers and ethylene or α-olefins, and also resins obtained by adding hydrogen to (co)polymers of these; (6) Ring-opening copolymers of norbornene monomers and non-conjugated dienes or norbornene monomers and non-conjugated dienes together with other monomers, and also polymers obtained by adding hydrogen to (co)polymers of these.

In contrast, the material used to form the cladding layer is one that enables cladding portions having a lower refractive index than that of the core portion and having superior flexibility to be obtained. Examples thereof include materials having as their primary material resin materials such as cyclic olefin-based resins such as acrylic resins, epoxy resins, polyimide-based resins, benzocyclobutene-based resins, and norbornene-based resins and the like. Among these, resin compositions that have as their primary material cyclic olefin-based resins such as benzocyclobutene-based resins and norbornene-based resins are preferable, and resin compositions that have as their primary compositions addition polymers of norbornene-based resins are particularly preferable.

(Second Embodiment)

Next, a second embodiment of the electronic apparatus, cellular phone, and flexible cable of the present invention will be described.

Figure 10A:
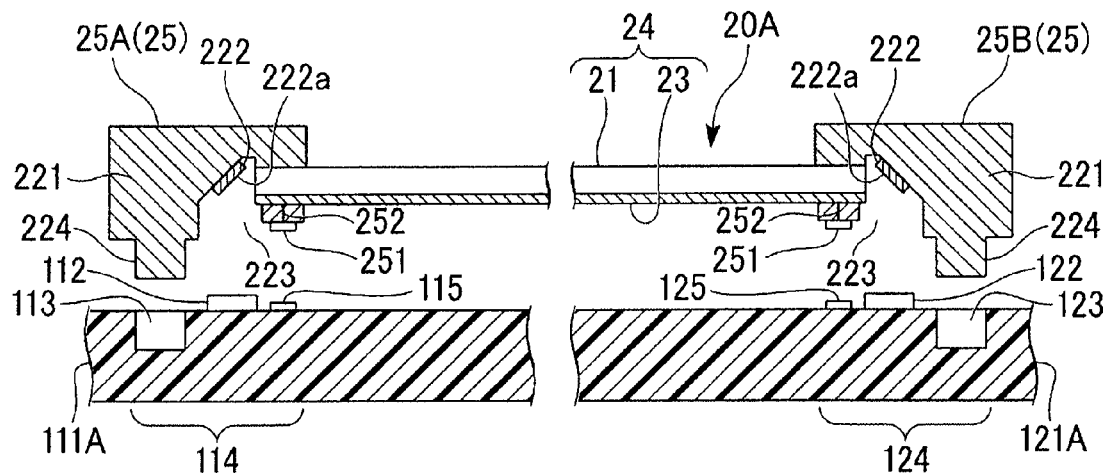
FIG. 10A is a view showing a relationship between a circuit board inside a first body and a circuit board inside a second body of a cellular phone according to a second embodiment of the present invention and a flexible cable (i.e., a cable fitted with a connector) used for transmitting signals.
Figure 10B:
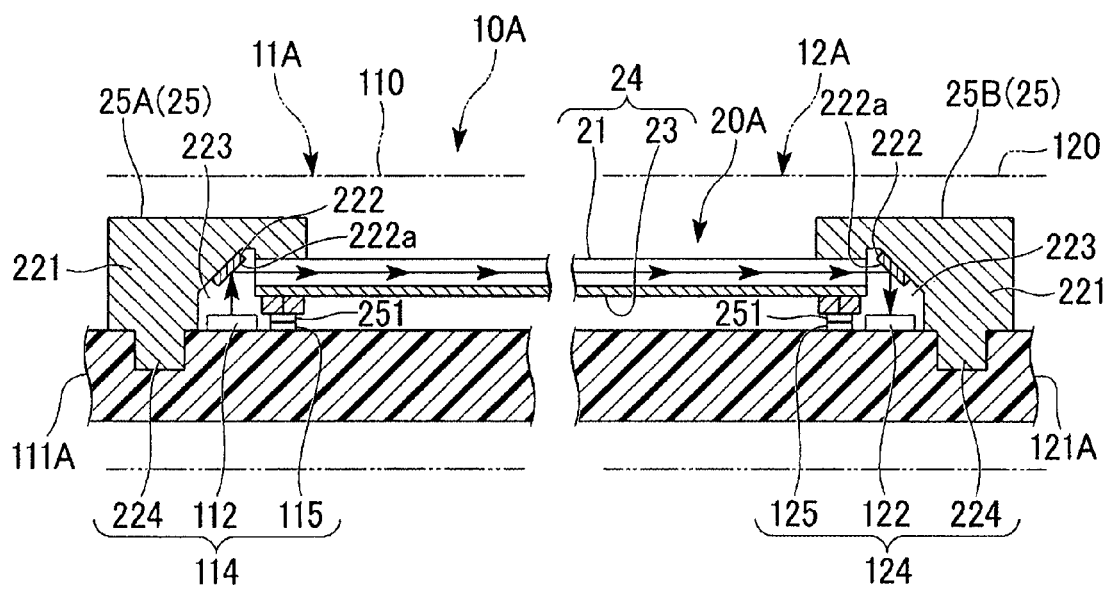
FIG. 10B is a view showing a relationship between a circuit board inside a first body and a circuit board inside a second body of a cellular phone according to a second embodiment of the present invention and a flexible cable (i.e., a cable fitted with a connector) used for transmitting signals.

As is shown in FIGS. 10A and 10B, in the embodiment described here, instead of the flexible cable 20 of the above described first embodiment, a flexible cable 20A is employed where connectors 25 are attached to both ends in the longitudinal direction of a flexible, belt-shaped cable body 24. The flexible, belt-shaped cable body 24 is an electro-optic composite device formed by joining together the above described optical waveguide forming body 21 and a flexible wiring substrate 23. The symbol 25A is used for one of the connectors 25 at the two ends in the longitudinal direction of the cable body 24, while the symbol 25B is used for the other connector 25.

Moreover, in this embodiment, a circuit board 111A where a connector connecting portion 114 (i.e., a cable connecting portion) to which is connected one of the connectors 25 of the flexible cable 20A is provided is housed in the outer casing 110 of the first body. A circuit board 121A where a connector connecting portion 124 (i.e., a cable connecting portion) to which is connected the other connector 25B of the flexible cable 20A is provided is housed in the outer casing 120 of the second body. In the drawings, the symbol 11A is used for the first body and the symbol 12A is used for the second body. Moreover, in FIG. 10B, the symbol 10A is a cellular phone.

This embodiment differs from the first embodiment in that the flexible cable 20A and the circuit boards 111A and 121A on which connector connecting portions are provided are employed. However, the remaining structure is the same as that of the first embodiment. Hereinafter, structural components that are the same as in the first embodiment are described using the same symbols.

Figure 11:
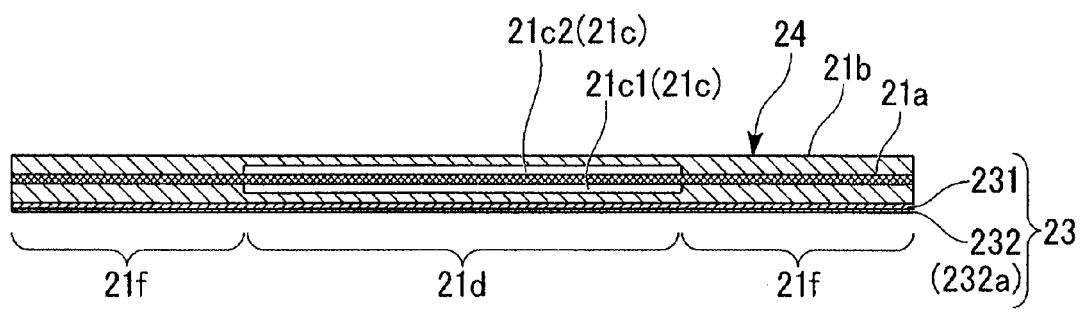
FIG. 11 is a cross-sectional view showing the structure (i.e., the structure of a cross-section extending in the longitudinal direction of the cable body) of the cable body of a flexible cable used in the cellular phone of the second embodiment of the present invention.
Figure 12:
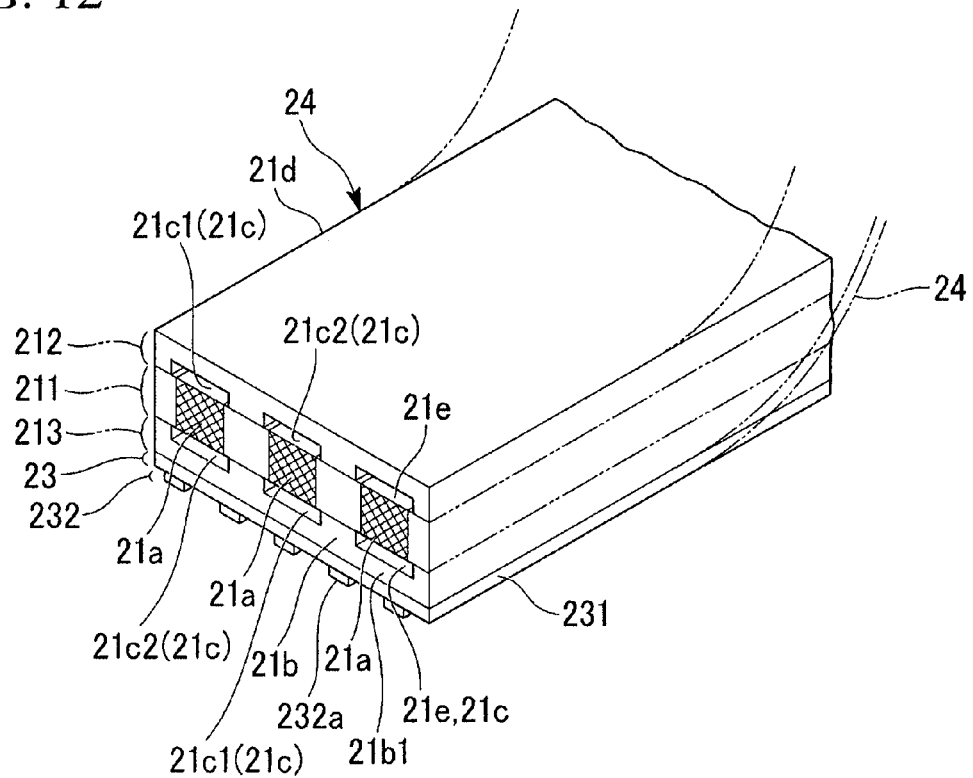
FIG. 12 is a cross-sectional perspective view showing the structure of the cable body shown in FIG. 11.
Figure 13:
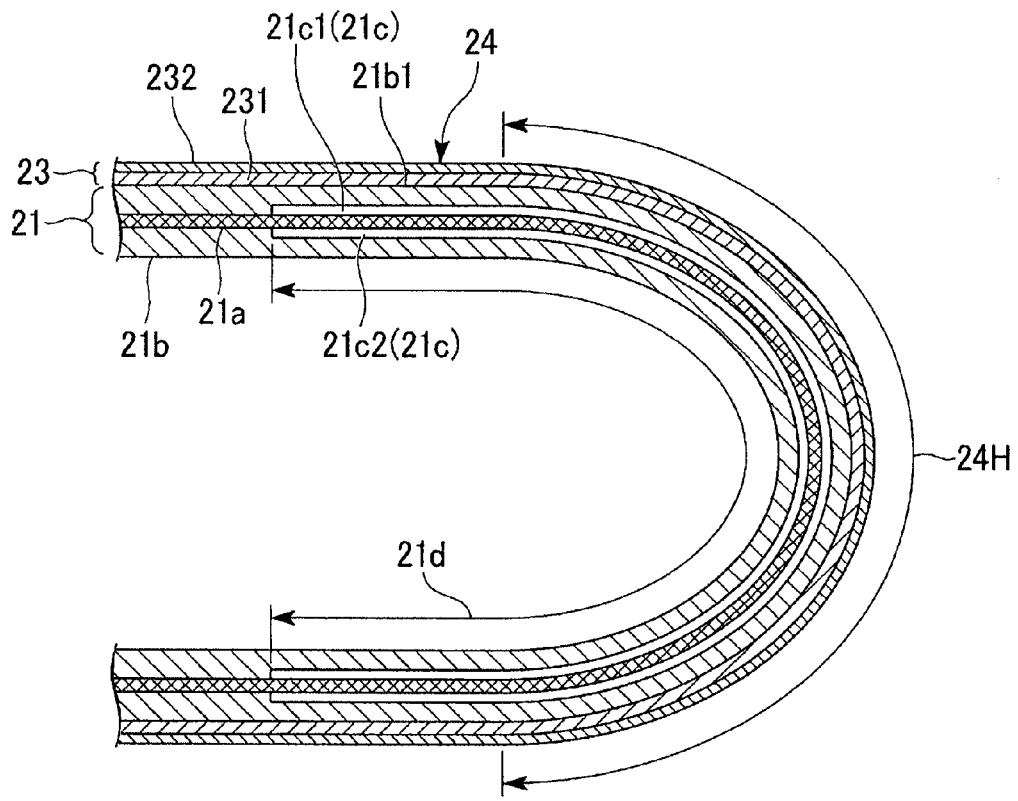
FIG. 13 is an enlarged cross-sectional view showing a state where bending deformation has been applied to a deforming section of the cable body shown in FIG. 11.

As is shown in FIG. 11, FIG. 12, and FIG. 13, the flexible wiring substrate 23 of the cable body 24 of the flexible cable 20A is formed in a flexible belt shape, and is provided on one surface (i.e., a surface on one side in the thickness direction) of the optical waveguide forming body 21 so as to extend over the entire length in the longitudinal direction of the optical waveguide forming body 21.

The position where the cable body 24 of the flexible cable 20A is laid in the cellular phone is the same as the position where the optical waveguide body 21 of the flexible cable 20 is laid in the first embodiment (see FIG. 1 and FIG. 6).

As is shown in FIG. 11 and FIG. 13, the cable body 24 of the flexible cable 20A is positioned such that the center portion in the longitudinal direction thereof is laid adjacent to the hinge portion 13 of the cellular phone. The cable body 24 has a deforming section 24H which is the portion that undergoes repeated bending deformation as the second body 12A is repeatedly opened and closed relatively to the first body 11A by being pivoted around the hinge portion 13.

In the internal air cladding portion 21d of the optical waveguide forming body 21, the range where the optical waveguide forming cable 21 and the cable body 24 are formed in the longitudinal direction is a range that includes the deforming section 24H and further extends out from the deforming section 24H on both sides.

The cable body 24 of the flexible cable 20A is formed in a rectilinear shape, and when the second body 12A of the cellular phone 10A is opened approximately 180 degrees from the first body 11A, it is in a state where substantially (or absolutely) no bending deformation is applied to the deforming section 24H. In contrast, if the second body 12A is closed against the first body 11A, the portion of the flexible cable 20A that is located adjacent to the hinge portion 13, namely, the deforming section 24H undergoes bending deformation.

As is shown in FIG. 13, in the flexible cable 20A, when bending deformation is applied to the deforming section 24H of the cable body 24 in the cellular phone (for example, when the second body is closed against the first body), the optical waveguide forming body 21 is located on the inner circumferential side of the flexible wiring substrate 23. As a result of this, when bending deformation is applied to the deforming section 24H, this vertical bending deformation is also applied to the optical waveguide forming body 21.

Note that the bending deformation generated when vertical bending is applied to the optical waveguide forming body 21 is also referred to as vertical bending for the cable body 24 as well.

As is shown in FIG. 12 and FIG. 13, the flexible wiring substrate 23 includes an electrically non-conductive base film 231 and a conductor layer that is provided on one surface of the base film 231. The surface of the base film 231 that is located on the opposite side from the conductor layer 232 is bonded to the optical waveguide forming layer 21.

Namely, in the cable body 24 of the flexible cable 20A, the conductor layer 232 and the optical waveguide forming body 21 are mutually laminated with the base film 231 interposed between them, so that the flexible wiring substrate 23 and the optical waveguide forming body 21 are mutually bonded together.

The thickness of the base film 231 of the flexible wiring substrate 23 is from 12.5 to 25 μm, and the thickness of the conductor layer 232 is from 5 to 10 μm. Moreover, this flexible wiring substrate 23 is formed in a belt shape, and is provided over the entire length of the optical waveguide forming body 21. The width dimensions of the flexible wiring substrate 23 may be uniform over the entire length in the longitudinal direction, however, it is not essential for them to be uniform over the entire length in the longitudinal direction. The width dimensions are, for example, from 3 to 10 mm, however, if appropriate or necessary, it is also possible for them to be less than 3 mm or larger than 10 mm.

A polyimide film, for example, can be beneficially used for the base film 231. The conductor film 232 is a conductive metal layer made, for example, from copper or the like. A substrate created by forming a wiring pattern (i.e., a conductor circuit 232a) on copper foil that has been adhered to one surface of the base film 231 can be favorably used as the flexible wiring substrate 23. However, the materials used for the base film 231 and the conductor layer 232 are not limited to these, and other known materials that are used for a flexible wiring substrate may be employed.

The following method, for example, may be used as the method for manufacturing the cable body 24.

Firstly, a varnish that contains a material for forming the cladding layers of the optical waveguide forming body 21 is coated onto the surface of the base film 231 of the flexible wiring substrate 23 which is on the opposite side from the conductor layer 232, and is then dried so as to form a dry coating film. Trenches 21e are then formed in this dry coating film by means of laser working or the like so that a cladding film formation film material is obtained. This cladding layer formation film material is adhered to the base film 231 of the flexible wiring substrate 23. Separately from this, the core layer 211 and the cladding layer formation film material (one where trenches have already been formed) are prepared, and these are then laminated on the cladding layer formation film material which is the dry coating film formed on the base film 231 of the flexible wiring substrate 23. Thermocompression bonding is then performed thereon so that a material laminated body is obtained. The cladding layer formation film material and the core layer 211 that is laminated on the cladding layer formation film material can be manufactured using the method described in the first embodiment. In the same way as in the thermocompression bonding step described in the first embodiment, the thermocompression bonding described here is achieved by heating the material laminated body to a temperature that is equal to or higher than the glass transition temperature Tg of the core layer 211 and/or the cladding layer formation film material while applying pressure thereto.

Next, the second ultraviolet light is irradiated onto this material laminated body so as to cure the cladding layer formation film material on both surfaces of the core layer 211, so that the cladding layers 212 and 213 are obtained. As a result of this, the optical waveguide forming body 21 is formed on one surface of the flexible wiring substrate 23 (i.e., the surface of the base film 231 on the opposite side from the conductor layer 232), and the flexible wiring substrate 23 and the optical waveguide forming body 21 are bonded together so as to form an integrated cable body 24.

Another manufacturing method different from this is also possible.

For example, the core layer 211 and the cladding layer formation film material (one where trenches have already been formed) are prepared, and these are then layered on the surface of the base film 231 of the flexible wiring substrate 23 on the opposite side from the conductor layer 232 so that a material laminated body is obtained. Furthermore, thermocompression bonding is then performed on the core layer 211 and the two cladding layer formation film materials by heating this material laminated body to a temperature that is equal to or higher than the glass transition temperature Tg of the core layer 211 and/or the cladding layer formation film material and applying pressure thereto. In addition, thermocompression bonding is then performed on the base film 231 of the flexible wiring substrate 23 and the cladding layer formation film materials that have been laminated thereon.

Next, the second ultraviolet light is irradiated onto the material laminated body created by bonding together via thermocompression the single core layer 211 and the two cladding layer formation film materials so as to cure the cladding layer formation film material on both surfaces of the core layer 211, so that the cladding layers 212 and 213 are obtained.

As is shown in FIGS. 10A and 10B, the connectors 25 at both ends of the flexible wiring substrate 20A have the same structure as each other.

The connector 25A has a structure where a connecting terminal 251 is provided in the housing 221 of the connector 22A that is provided at both ends of the flexible cable 20 described in the first embodiment. The conductor circuit 232a which is formed by the conductor layer 232 of the flexible wiring substrate 23 (see FIG. 11) and an electrode portion 115 that is provided on the connector connecting portion 114 of the circuit board 111A of the first body 11A are electrically connected by means of this connecting terminal 251. In addition, the connecting terminal 251 is provided in an exposed state on the outer surface of the housing 221, and is electrically connected via an energizing communicating portion 252 such as a wire or the like to the conductor circuit 232a of the flexible wiring substrate 23.

By pressing the engaging projection 224 which is standing upright from the housing 221 into the engaging recess 113 which is formed in the circuit board 111A of the first body 11A, the connector 25A is positioned relative to the circuit board 111A. Accordingly, the connector 25A can be accurately installed in a suitable position on (i.e., connected to) the connector connecting portion 114 of the circuit board 111A.

The connector connecting portion 114 of the circuit board 111A includes an optical element (here, the light emitting element 112) which is packaged on the circuit board 111A, the engaging recess 113 which is formed in the vicinity of this optical element, and the electrode portion 115 which is provided on the circuit board 111A in the vicinity of the engaging recess 113. The electrode portion 115 is electrically connected to circuit wiring (not shown) that is formed on the circuit board 111A.

Note that the structure of this connector connecting portion 114 is formed by adding the electrode portion 115 to the connector connecting portion of the circuit board 111 provided on the first body 11 described in the first embodiment.

When the connector 25A is installed on (i.e., connected to) the connector connecting portion 114 as is described above, the mirror 222 is positioned on the optical axis of light output by the light emitting element 112 of the connector connecting portion 114, and the light output by the light emitting element 112 can be irradiated via the mirror 222 onto the optical waveguide forming body 21. Moreover, at this time, the connecting terminal 251 which is provided at a position on the opposite side from the engaging projection 224 of the housing 221 (so as to avoid the engaging projection 224 of the housing 221) with the recess 223 interposed between them contacts the electrode portion 115, and can be electrically connected to the electrode portion 115. As a result of this, the conductor circuit 232a (see FIG. 11) of the flexible wiring substrate 23 of the flexible cable 20A can be electrically connected to the circuit of the circuit board 111A.

The connector having the symbol 25B has the same structure as the connector 25A. Namely, the engaging projection 224 which is standing upright from the housing 221 is pressed into the engaging recess 123 which is formed in the circuit board 121A of the second body 12A. As a result, the connector 25B is positioned relative to the circuit board 121A, and can be installed on (i.e., connected to) the connector connecting portion 124 of the circuit board 121A.

The connector connecting portion 124 of the circuit board 121A includes the engaging recess 123, an optical element (here, the photoreceptor element 122) which is packaged on the circuit board 121A adjacent to the engaging recess 123, and an electrode portion 125 which is provided on the circuit board 121A in the vicinity of the engaging recess 123. The electrode portion 125 is electrically connected to circuit wiring (not shown) that is formed on the circuit board 121A.

The structure of this connector connecting portion 124 is formed by adding the electrode portion 125 to the connector connecting portion of the circuit board 121 provided on the second body 12 described in the first embodiment.

When the connector 25B is installed on (i.e., connected to) the connector connecting portion 124 as is described above, the mirror 222 is positioned on the optical axis of light received by the photoreceptor element 122 of the connector connecting portion 124, and the transmission light of the optical waveguide forming body 21 can be received by the photoreceptor element 122. Moreover, at this time, the connecting terminal 251 which is provided at a position on the opposite side from the engaging projection 224 of the housing 221 (so as to avoid the engaging projection 224 of the housing 221) with the recess 223 interposed between them is made contact with the electrode portion 125 of the connector connecting portion 124, and can be electrically connected to the electrode portion 125. As a result of this, the conductor circuit 232a of the flexible wiring substrate 23 of the flexible cable 20A can be electrically connected to the circuit of the circuit board 121A.

In the present embodiment, as is shown in FIGS. 10A and 10B, the one connector 25A of the flexible cable 20A is connected to the connector connecting portion 114 of the circuit board 111A of the first body 11A, and the other connector 25B is connected to the connector connecting portion 124 of the circuit board 121A of the second body 12A. As a result, the electronic circuit on the circuit board 111A side of the first body 11A and the electronic circuit on the circuit board 121A side of the second body 12A are electrically connected together via the flexible wiring substrate 23 of the flexible cable 20A. Furthermore, it is also possible to transmit optical signals from the first body 11A side to the second body 12A side via the optical waveguide forming body 21 of the flexible cable 20A.

It is thus also possible in the cellular phone 10A which uses the above described flexible cable 20A that superior folding endurance is secured in the optical waveguide forming body 21 by providing the internal air cladding portion 21d.

Note that as was also described in the first embodiment, it is also possible to provide elastic claws in the connectors 25 to enable them to be removably engaged in the circuit board in the same way as in the first embodiment.

Moreover, in the connector connecting portions provided on the circuit board, the positioning portions that are used to position the connectors of the flexible cable are not limited to the aforementioned engagement recesses 113 and 123. In the same way as in the first embodiment, it is also possible to employ frames or positioning projections and the like. The shape of the connectors 25 can also be altered in accordance with the positioning portions on the circuit board side, and it is also possible to employ a structure where the connectors 25 include no engaging projections.

(Third Embodiment)

Next, a third embodiment of the electronic apparatus and cellular phone of the present invention will be described.

Figure 14:
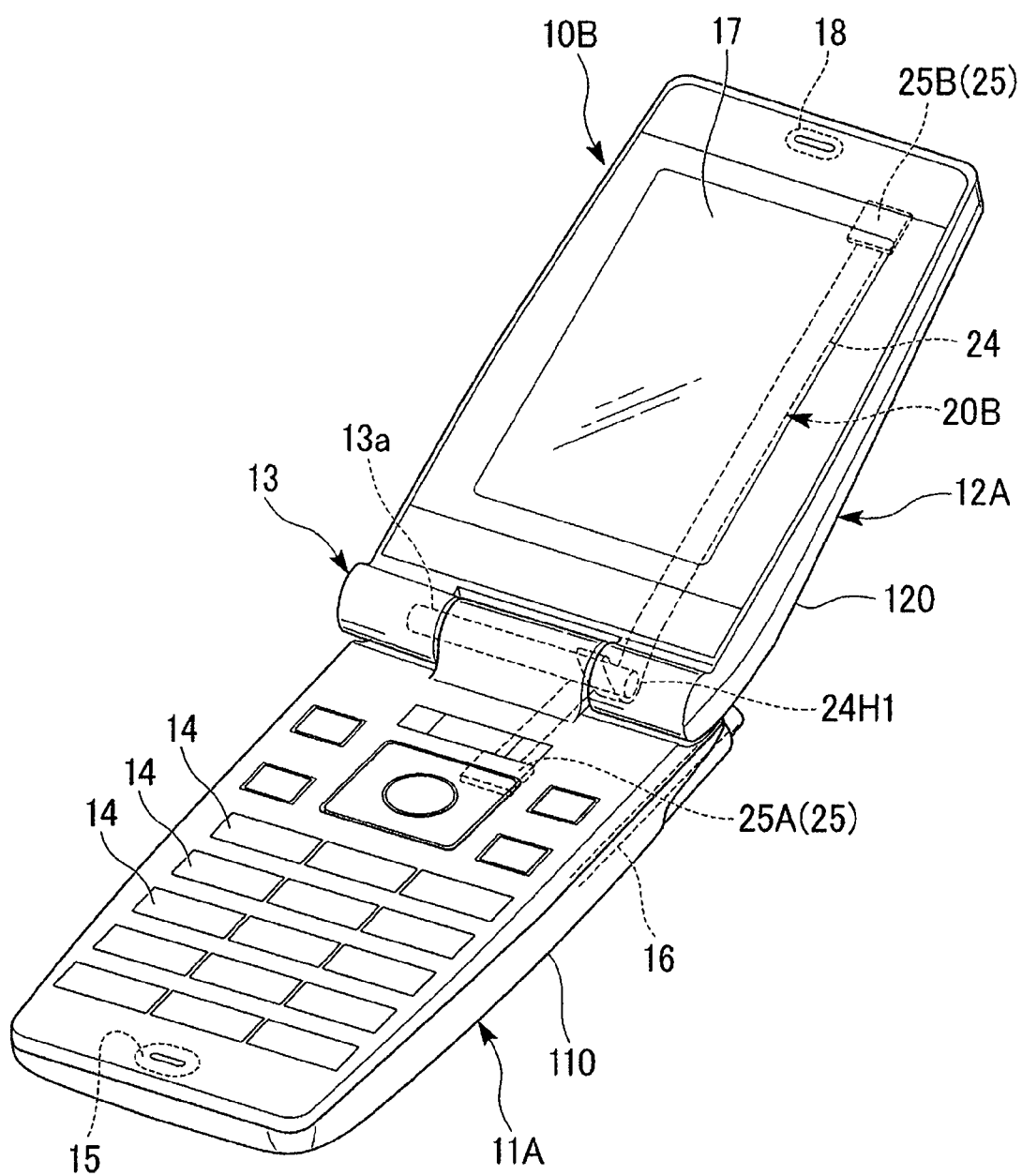
FIG. 14 is a perspective view showing a cellular phone according to a third embodiment of the present invention.
Figure 15:
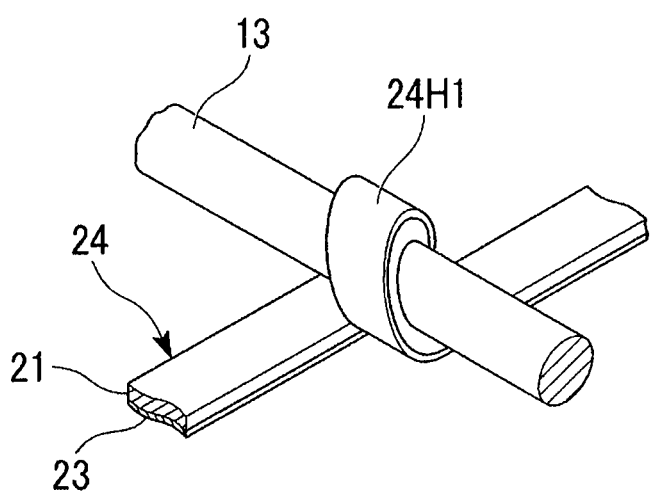
FIG. 15 is an enlarged perspective view showing the vicinity of a deforming section of the cable body of a flexible cable in the cellular phone shown in FIG. 14.

FIG. 14 is an overall perspective view showing a cellular phone 10B according to this embodiment, while FIG. 15 is a view showing the vicinity of the pivot shaft 13a (see FIG. 14) of the hinge portion 13. As is shown in FIG. 14 and FIG. 15, in this embodiment the center portion in the longitudinal direction of the cable body 24 of the flexible cable 20A of the second embodiment is provided in a state of being wound one or more times (may be referred to below as α-winding) around the outer circumference of the pivot shaft 13a of the hinge portion 13.

The entire portion of the cable body 24 that is α-wound around the outer circumference of the pivot shaft 13a of the hinge portion 13 is the deforming section 24H1 that undergoes repeated bending deformation in conjunction with the repeated opening and closing of the second body 12A as it is pivoted relatively to the first body 11A. The internal air cladding portion (not shown) of the optical waveguide forming body 21 is either set to a range that matches the deforming section 24H1 of the cable body 24 in the longitudinal direction of the optical waveguide forming body 21, or to a range that includes this deforming section 24H1 and is also wider than this deforming section 24H1.

The deforming section 24H1 of the cable body 24 is wound such that the positions of the two ends in the longitudinal direction of the cable body 24 are mutually offset in the axial direction of the pivot shaft 13a of the hinge portion 13. One end side in the longitudinal direction of the cable body 24 is provided in the first body 11A while the other end side is provided in the second body 12A.

The bending deformation that is applied to the deforming section 24H1 of the cable body 24 is vertical bending. Moreover, the cable body 24 is provided such that, in the α-wound deforming section 24H1, the optical waveguide forming body 21 faces towards the inner circumferential side of the flexible wiring substrate 23.

(Fourth Embodiment)

In the electronic apparatus and cellular phone of the fourth embodiment of the present invention, the flexible cable 20 described in the first embodiment is employed instead of the flexible cable 20A in the above described third embodiment.

Namely, a structure is employed where the center portion in the longitudinal direction of the optical waveguide forming body 21 of the flexible cable 20 is α-wound around the outer circumference of the pivot shaft 13a of the hinge portion 13. In this case as well, the internal air cladding portion (not shown) of the optical waveguide forming body 21 is either provided in a range that matches the deforming section which is the portion in the longitudinal direction of the optical waveguide forming body 21 that is α-wound around the outer circumference of the pivot shaft 13a of the hinge portion 13, or in a range that includes this deforming section and is also wider than this deforming section.

(Fifth Embodiment)

Next, a fifth embodiment of the electronic apparatus and cellular phone of the present invention will be described.

Figure 16A:
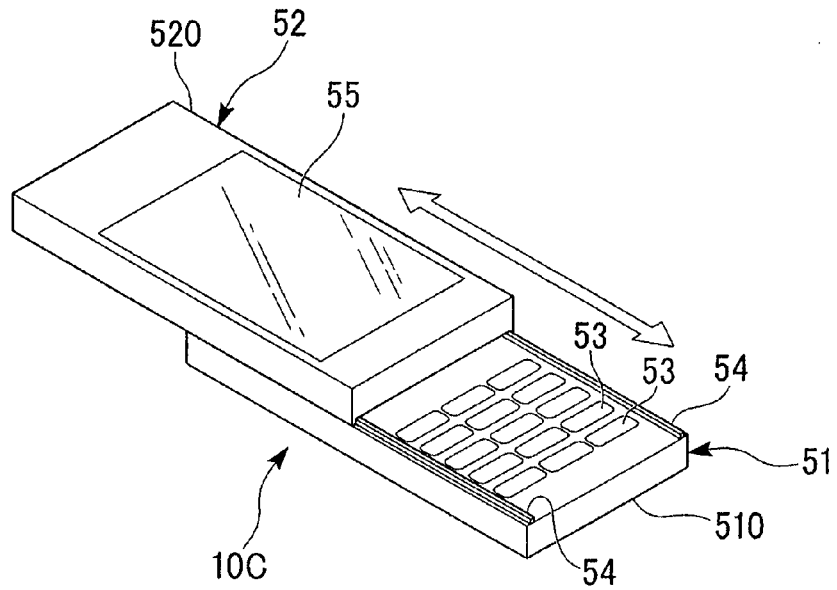
FIG. 16A is an overall perspective view showing a cellular phone according to a fifth embodiment of the present invention.
Figure 16B:
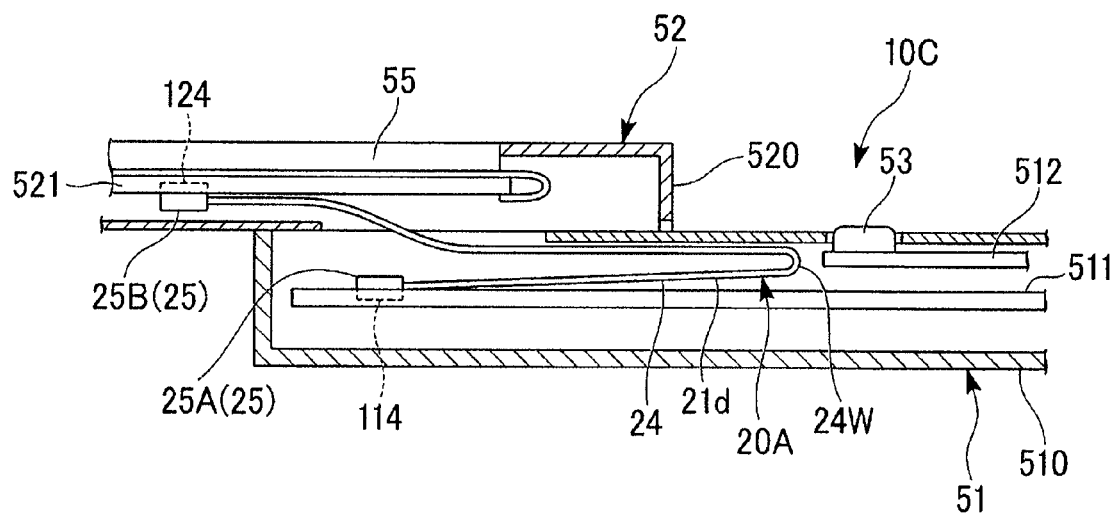
FIG. 16B is a cross-sectional view showing the internal structure of a cellular phone according to a fifth embodiment of the present invention.
Figure 16C:
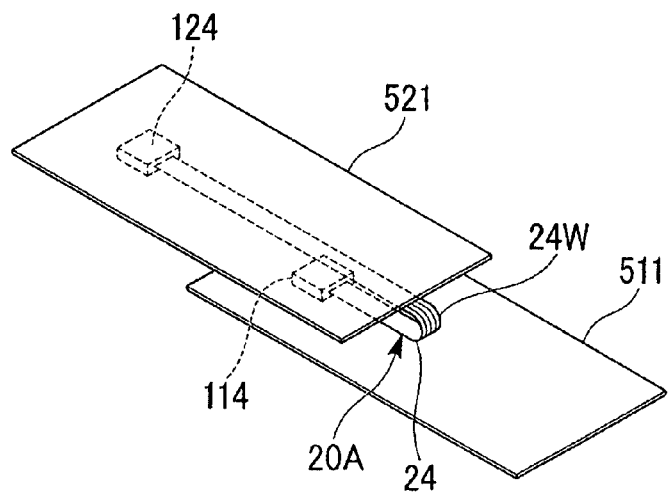
FIG. 16C is a view showing the cellular phone of the fifth embodiment of the present invention, and it is a perspective view showing a relationship between the circuit board of the first body and the circuit board of the second body and the flexible cable.

As is shown in FIGS. 16A and 16B, in the embodiment described here, what is known as a sliding type of cellular phone 10C is illustrated as the electronic apparatus and cellular phone of the present invention. Note that component elements that are the same as those in the first and second embodiments are described using the same descriptive symbols.

This cellular phone 10C includes a first body 51 where are provided input operation buttons 53, a microphone (not shown), an antenna (not shown), and a transmission and reception circuit, and with a second body 52 that slides relatively to the first body 51 along guide rails 54 provided on the first body 51. A display unit 55 and a speech output unit (not shown) are also provided in the second body 52.

As is shown in FIG. 16B, a circuit board 511 and a key sheet 512 on which the input operation buttons 53 are mounted are housed within an outer casing 510 of the first body 51. A switching circuit is provided on the key sheet 512. The switching circuit on the key sheet 512 and the transmission and reception circuit are electrically connected to a circuit that is provided on the circuit board 511. Moreover, the display unit 55 of the second body 52 is electrically connected to a circuit that is provided on a circuit board 521 that is housed within an outer casing 520 of the second body 52.

In this cellular phone 10C, the flexible cable 20A described in the second embodiment is employed as a flexible cable for transmitting signals between the first body 51 and the second body 52.

In the same way as in the circuit board of the first body and the circuit board of the second body described in the second embodiment, connector connecting portions are provided in the circuit board 511 of the first body 51 and in the circuit board 521 of the second body 52.

One of the connectors 25 (i.e., the connector 25A) that are provided at both ends of the flexible cable 20A is connected to the connector connecting portion 114 provided on the circuit board 511 of the first body 51, and the other connector 25B is connected to the connector connecting portion 124 provided on the circuit board 521 of the second body 52. As a result, the electronic circuit on the circuit board 511 side of the first body 51 and the electronic circuit on the circuit board 521 side of the second body 52 are electrically connected together via the conductor wiring 232a (see FIG. 12) of the flexible wiring substrate 23 of the flexible cable 20A. Moreover, an optical element (here, the light emitting element 112) provided on the circuit board 511 of the first body 51 and an optical element (here, the photoreceptor element 122) provided on the circuit board 521 of the second body 52 are optically connected via the optical waveguide forming body 21 of the flexible cable 20A.

The cable body 24 of the flexible cable 20A is provided in a state of being bent in a U-shape between the circuit board 511 of the first body 51 and the circuit board 521 of the second body 52. A bent portion 24W which is deformed by being bent in a C-shape is formed in a portion in the longitudinal direction of the cable body 24. The position of this bent portion 24W moves in the longitudinal direction of the cable body 24 in conjunction with the sliding movement (i.e., the movement along the guide rails 54) of the second body 52 relative to the first body 51.

Accordingly, in this cable body 24, the entire portion where the bent portion 24W is formed functions as the portion to which bending deformation is applied, namely, as a deforming section in conjunction with the sliding movement of the second body 52 relative to the first body 51. In the cellular phone 10C shown in the drawings, the entire portion (i.e., the entire length) that is located between the connectors 25A and 25B which are mounted at both ends of the cable body 24 of the flexible cable 20A functions as a deforming section.

In the optical waveguide forming body 21 of the cable body 24, the entire length of the portion that corresponds to the deforming section of the cable body 24 in the longitudinal direction thereof forms the internal air cladding portion 21d, and solid portions that do not have internal air layers 21c are secured on both sides (i.e., both end portions in the longitudinal direction) of the internal air cladding portion 21d. It is more preferable for the internal air cladding portion 21d to be provided over a range that includes the portion that corresponds to the deforming section of the cable body 24 and that is wider than this deforming portion in the longitudinal direction of the optical waveguide forming body 21.

In this cellular phone 10C, the flexible cable 20A is provided facing in a direction that enables vertical bending to be applied to the cable body 24. Moreover, the flexible cable 20A is provided such that the cable body 24 is facing in a direction that causes the optical waveguide forming body 21 to be on the inner circumferential side of the flexible wiring substrate 23 in the bent portion 24W.

(Sixth Embodiment)

In the electronic apparatus and cellular phone of the sixth embodiment of the present invention, the flexible cable 20 described in the first embodiment is employed instead of the flexible cable 20A in the above described fifth embodiment.

(Specific Examples of an Optical Waveguide Forming Body)

Specific examples of an optical waveguide forming body that can be applied to the electronic apparatus, cellular phone, and flexible cable of the present invention, as well as of a method of manufacturing this optical waveguide forming body will now be described.

EXAMPLE 1

[Preparation of a Core Layer Formation Film Material]

A hexylnorbornene (HxNB)/diphenylmethyl norbornene methoxysilane (diPhNB)-based polymer (wherein $x=0.32$, $y=0.68$, and $n=5$) expressed by the following structural formula (Compound 1) was synthesized. Next, this norbornene-based polymer was dissolved in mesitylene, so that a 10 wt % copolymer solution was prepared. The aforementioned RHODORSIL PHOTOINITIATOR 2074 (CAS No. 178233-72-2) ($2.55 \times 10^{-3}$ g, $2.51 \times 10^{-6}$ mol, in 0.1 mL of methylene chloride) serving as a first photo-acid generator having an absorption maximum wavelength of 220 nm, as well as 3.0 g of a monomer oxidation inhibitor solution (described below), and Pd(PCy$_3$)$_2$(OAc)$_2$ (Pd785) ($4.95 \times 10^{-4}$ g, $6.29 \times 10^{-7}$ mol, in 0.1 mL of methylene chloride) were added to the above copolymer solution, and were uniformly dissolved so that a varnish to be used for the core layer was prepared.

Note that when the molecular weight of the synthesized copolymer was measured using gel permeation chromatography (GPC: THF solvent, polystyrene reduction), it was found that the mass average molecular weight (Mw) was 118000, and the number average molecular weight (Mn) was 60000.

The monomer oxidation inhibitor solution was obtained by adding to HxNB (42.03 g, 0.24 mol) and bis-norbornene methoxydimethylsilane (SiX, CAS No. 376609-87-9) (7.97 g, 0.026 mol), two types of oxidation inhibitor, namely, Irganox (registered trademark—the same applies below) 1076, manufactured by Ciba Specialty Chemicals of Tarrytown, N.Y. state (0.5 g), and Irgafos (registered trademark—the same applies below) 168, manufactured by the same company (0.125 g).

[Compound 1]

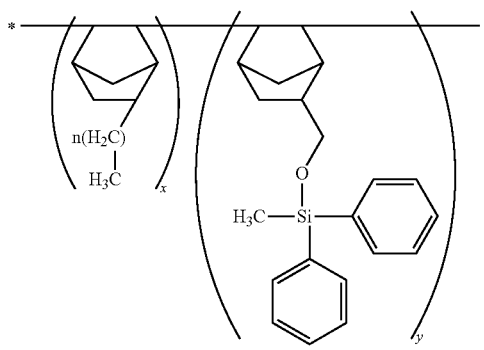

A coating film was formed by coating the above described core varnish onto a polyethylene terephthalate (PET) film using a doctor blade. This coating film was then placed on a hot plate together with the PET film and dried. As a result, a dry coating film (i.e., a film material for forming a core layer) having a thickness of 50 μm was obtained.

Next, first ultraviolet light having a wavelength of less than 300 nm (or 365 nm or less) was irradiated, (in an irradiation quantity of 500 mJ/cm$^2$) from a high-pressure mercury lamp or a metal halide lamp via a photomask having an aperture pattern that corresponds to the cladding portion, onto the obtained dry coating film so as to pattern the core portion. The coating film was then heated in an oven and cured, so that a core layer was obtained.

Note that the thickness of the core layer was 50 μm, and the core portion was formed having a square cross-section where the length of one side was 50 μm and in a rectilinear shape extending over the entire length in the longitudinal direction of a three-layer optical waveguide.

[Preparation of a Cladding Layer Formation Film Material]

Firstly, a decylnorbornene (DeNB)/methyl glycidyl ether norbornene (AGENB)-based polymer (wherein $x=0.77$, $y=0.23$, and $n=10$) expressed by the following structural formula (Compound 2) was synthesized. Next, this norbornene-based polymer was dissolved in anhydrous toluene, so that a 20 wt % copolymer solution was prepared. A cladding varnish was also prepared by dissolving in 50 g of the above polymer solution, two types of oxidation inhibitor, namely, Irganox 1076, (0.01 g), and Irgafos 168 (0.0025 g), both manufactured by Ciba, as well as a second photo-acid inhibitor (TAG-382 manufactured by Toyo Ink Mfg. Co., Ltd.) having an absorption maximum wavelength of 335 nm.

Note that when the molecular weight of the synthesized copolymer was measured using gel permeation chromatography (GPC: THF solvent, polystyrene reduction), it was found that the mass average molecular weight (Mw) was 75000, and the number average molecular weight (Mn) was 30000.

A coating film was formed by coating this cladding varnish onto a polyethylene terephthalate (PET) film using a doctor blade. This coating film was then dried in a drier together with the PET film so that a dry coating film having a thickness of 20 μm was obtained. An excimer laser was then irradiated onto this dry coating film so as to form trenches having a depth of 7 μm and a width of 100 μm, so that a film material for forming cladding layers was obtained (trench working step). The positions where the trenches were formed were adjusted so as to correspond to the positions of the core portions on the core layer to which the cladding layer formation film material was bonded. When the cladding layer formation film material was bonded to the core layer, all of the portions that were exposed on the two surfaces of the core layer of the core portion were in contact with an air layer that was secured in the optical waveguide forming body by the trench portions.

[Compound 2]

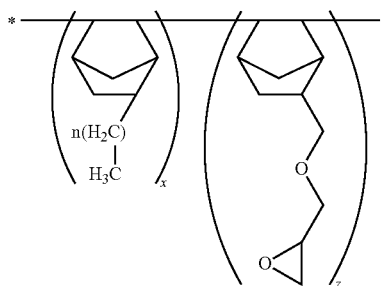

[Preparation of a Material Laminated Body and 3-Layer Optical Waveguide (Optical Waveguide Forming Body)]

Next, the cladding layer formation film material was peeled away from the PET film, and one layer of this material was laminated onto each one of the two surfaces of the core layer so that a material laminated body having a 3-layer structure was formed. Next, this material laminated body was loaded into a laminator set to 120° C., and was compressed for 5 minutes at a pressure of 0.2 MPa so as to become thermocompression bonded.

Thereafter, second ultraviolet light was irradiated (in an irradiation quantity of 100 mJ/cm$^2$) from a high-pressure mercury lamp or a metal halide lamp via a wavelength cutoff filter that occludes wavelengths of 300 nm or less onto the material laminated body at room temperature and at normal pressure. After the irradiation of this ultraviolet light, the material laminated body was immediately heated in a dryer at 150° C. for 30 minutes so that the cladding layer formation film material was cured (i.e., formed into cladding). Accordingly, the strengthening of the adhesive force between the core layer and the cladding layers was completed. As a result, a rectilinear 3-layer optical waveguide (i.e., optical waveguide forming body) having a width of 0.5 cm, a length of 10 cm, a core layer thickness of 50 µm, a cladding layer thickness of 20 µm, and an overall thickness of 90 µm (i.e., the sum of the thickness of the single core layer and the thicknesses of the two cladding layers) was obtained.

Note that the internal air cladding portion was formed by the trenches formed in the cladding layer formation film material over a range which excludes areas 2 cm inwards from the two ends in the longitudinal direction of the optical waveguide forming body (namely, in a range of 3 cm on both sides from the center in the longitudinal direction of the optical waveguide forming body). The obtained optical waveguide forming body had a structure made up of the internal air cladding portion having a length of 4 cm in the center portion in the longitudinal direction of the optical waveguide forming body, and solid portions having a length of 3 cm on both sides in the longitudinal direction of this internal air cladding portion. Moreover, the air layer of the obtained optical waveguide forming body had dimensions of 100 µm in the width direction of the optical waveguide forming body, and 7 µm in the thickness direction of the optical waveguide forming body.

COMPARATIVE EXAMPLE 1

A 3-layer optical waveguide was prepared by performing the same tasks as those performed in Example 1 apart from omitting the trench working step described in Example 1, and thermocompression bonding a cladding layer formation film material on which trenches had not been formed onto the core layer. This was taken as Comparative example 1. This 3-layer optical waveguide was solid over its entire length in the longitudinal direction.

(Measurement of the Increased Loss Value)

A test piece of Example 1 and a test piece of Comparative example 1 were prepared, and the measurement of the increased loss value described below (see FIGS. 17A and 17B) was performed.

Figure 17A:
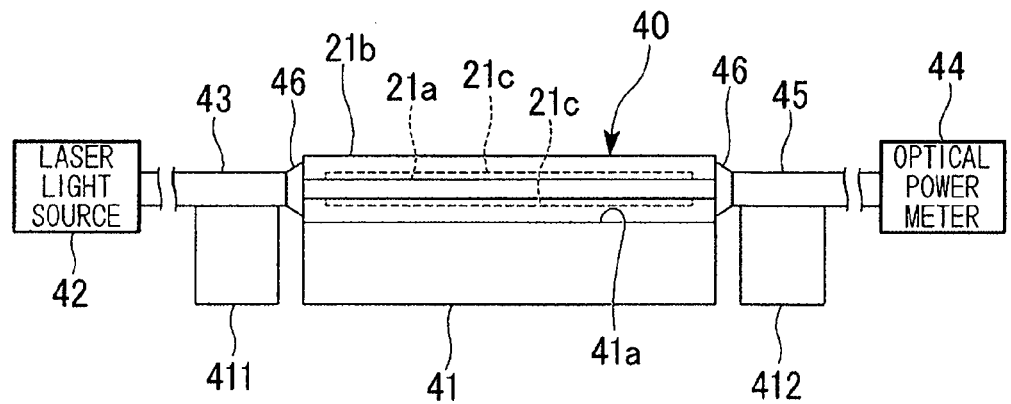
FIG. 17A is a view illustrating the measurement of increased loss values for a test specimen of the optical waveguide forming body of Example 1 of the present invention and for a test piece of Comparative example 1, and shows a case where the measurement of increased loss values is performed while the test piece is in an elongated state (i.e., is not bent).

Firstly, as is shown in FIG. 17A, a test piece 40 was mounted in a stretched out (i.e., unbent) state on a stage capable of making precise movements (i.e., a precision stage 41). Next, a distal end (i.e., an end portion on the opposite side from the laser light source) of an incident-side multimode fiber 43 that was connected to a laser light source 42 (i.e., a laser diode) having a wavelength of 830 nm was placed against one end of the core portion 21a of this test piece 40, while a distal end (i.e., an end portion on the opposite side from the optical power meter 44) of an emission-side multimode fiber 45 that was connected to an optical power meter 44 was placed against the other end of the core portion 21a. Spaces between the core portion 21a and the multimode fibers 43 and 45 were filled with matching oil 46.

Next, the laser light source 42 was operated such that laser light having a wavelength of 830 nm was output, and the precision stage 41 was operated and centered such that the output value from the optical power meter 44 (in other words, the quantity of reception light) was at maximum. The light intensity was then measured by the optical power meter 44. The optical intensity at this time was taken as $P_0$.

Note that in order for this centering to be performed efficiently a precision stage 411 for precisely moving the incident-side multimode fiber 43 and a precision stage 412 for precisely moving the emission-side multimode fiber 45 were also used.

Figure 17B:
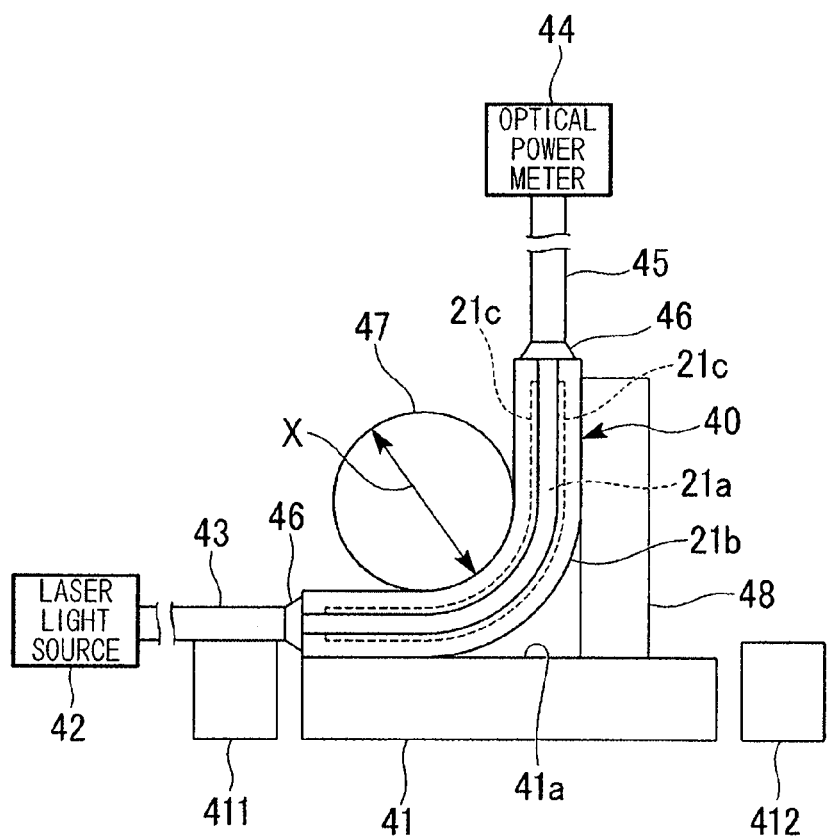
FIG. 17B is a view illustrating the measurement of increased loss values for a test specimen of the optical waveguide forming body of Example 1 of the present invention and for a test piece of Comparative example 1, and shows a case where the measurement of increased loss values is performed when the test piece has undergone bending deformation.

Next, as is shown in FIG. 17B, the center portion in the longitudinal direction of the test piece 40 was bent 90 degrees around the outer circumference of a stainless rod 47 having a diameter X, and the multimode fibers 43 and 45 were placed against the two ends of the test piece 40. While this 90 degree bent state was maintained, centering adjustment was performed in the same way as in the above described measuring, and the optical intensity was measured using the optical power meter 44. The bending that was applied to the test piece 40 using the stainless rod 37 was vertical bending. The optical intensity at this time was taken as $P_X$.

Note that in order to perform efficiently the tasks of bending the test piece 40 by 90 degrees using the stainless rod 37, and of stably maintaining the test piece 40 in a 90 degree bent state, as is shown in FIG. 17B, a supporting plate 48 was fixed onto the precision stage 41 so as to be perpendicular to a top surface 41a of this precision stage 41, so that the test piece 40 that had been made by the stainless rod 47 to conform to the outer circumference of the stainless rod 47 was pressed by the top surface 41a of the precision stage 41 and by the supporting plate 48. As a result of this, one end side in the longitudinal direction of the test piece 40 which had been bent 90 degrees around the outer circumference of the stainless rod 47 was made to conform to the top surface 41a of the precision stage 41, while the other end side in the longitudinal direction of the test piece 40 was made to conform to the supporting plate 48.

Four test pieces of Example 1 and 15 test pieces of Comparative example 1 were prepared for a total of 19 test pieces. The above described increased loss value measurement was performed for each test piece, and excess loss ΔP (dB), which is the difference ($P_X$-$P_O$) between insertion loss $P_X$ in the test piece when vertical bending was applied thereto (hereinafter, this may be referred to as vertical bending insertion loss), and insertion loss $P_O$ measured when the test piece was extended in a straight line (hereinafter, this may be referred to as rectilinear insertion loss), was checked.

The vertical bending insertion loss was measured for each test piece in the following sequence, namely, when the diameter X of the stainless rod 47 was 10 mm, when it was 5 mm, and when it was 2 mm. Namely, for one test piece, the diameter X of the stainless rod 47 was altered and the measurement of the vertical bending insertion loss was performed three times. The results are shown in FIG. 18.

Note that in the measurement of the vertical bending insertion loss, half of the diameter X of the stainless rod 47 formed a bend radius R that is applied to the test piece 40. The bend radius of the test piece 40 to which bending deformation was applied when vertical bending insertion loss was being measured was 5 mm when the diameter X of the stainless rod 47 was 10 mm, 2.5 mm when this diameter X was 5 mm, and 1 mm when this diameter X was 2 mm. In FIG. 18, the bend radii are displayed as R5 mm, R2.5 mm, and R1 mm to correspond to this.

Figure 18:
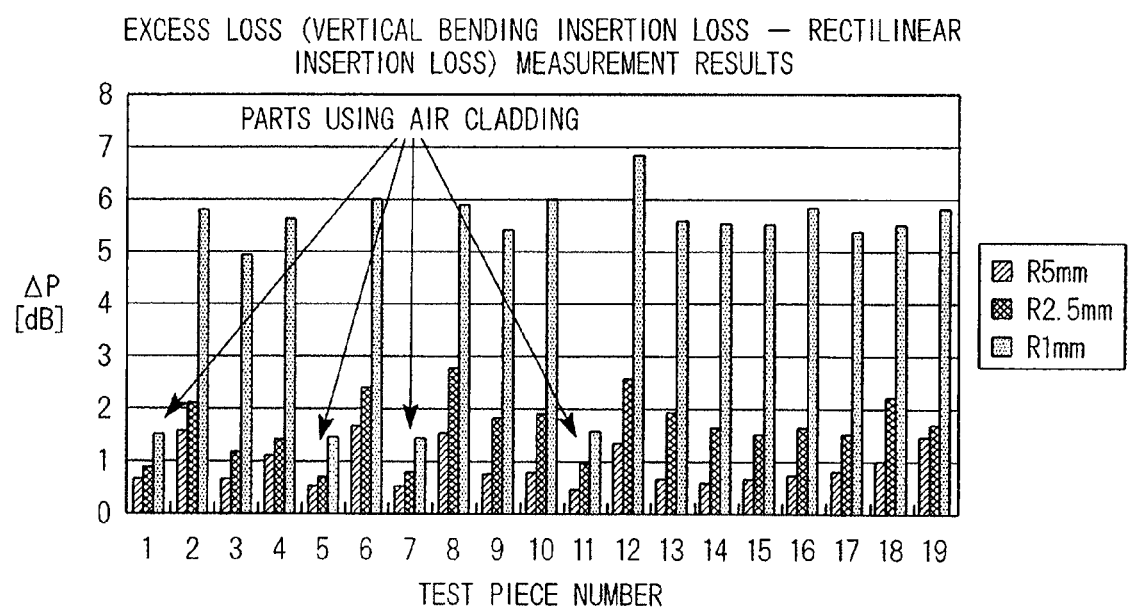
FIG. 18 is a graph showing the results obtained from the measurements of the increased loss values shown in FIG. 17.

In FIG. 18, the horizontal axis is the number allocated to the test piece (i.e., the test piece number), and the test pieces having the numbers 1, 5, 7, and 11 are the four test pieces from Example 1, while the remaining 15 test pieces are from Comparative example 1.

As can be understood by referring to FIG. 18, in the results of the increased loss value measurement, when the bend radius was R5 mm, there were no apparent differences (i.e., trend) in the excess loss ΔP between the test pieces of Example 1 and the test pieces of Comparative example 1. However, when the bend radius was R2.5 mm, a tendency for the excess loss ΔP in the test pieces of Example 1 to be less than in the test pieces for Comparative example 1 was evident. Furthermore, when the bend radius was R1 mm, it was clear that the excess loss ΔP in the test pieces of Example 1 was considerably less than in the test pieces for Comparative example 1.

From these results it was confirmed that if the test pieces (i.e., the optical waveguide forming body) of Example 1 which had an internal air cladding portion were used, then the folding endurance could be markedly improved in a bend radius of between approximately 1 and 2.5 mm.

(Specific Example of a Cable Body of a Flexible Cable)

EXAMPLE 2

A cable body (i.e., an electro-optic composite device) was prepared by bonding onto one surface in the thickness direction of the optical waveguide forming body of Example 1 a copper clad substrate which was formed by adhering copper film to one surface of a polyimide film (Example 2).

Firstly, a copper clad substrate having a total thickness of 17.5 μm was prepared by adhering copper foil having a thickness of 5 μm onto one surface of a base film which was formed by a polyimide film having a thickness of 12.5 μm. Varnish that included the material for forming the cladding layer of the optical waveguide forming body (i.e., the cladding varnish used in Example 1) was then coated by a doctor blade onto the surface on the opposite side of the base film of the flexible wiring substrate from the side where the semiconductor layer was located. The resulting body was then dried in an oven so that a dry coated film having a thickness of 20 μm was obtained. Laser working using an excimer laser was then performed on this dry coating film so as to form trenches having a depth of 7 μm and a width of 100 μm.

The copper clad substrate was used in this state without wiring being formed in the copper foil. Namely, this copper clad substrate functions as a flexible wiring substrate where the entire copper foil acts as wiring.

Separately to this, a core layer and cladding layer formation film material (where trenches have already been formed) were prepared.

The manufacturing method and the materials used to create the core layer and the cladding layer formation film material were the same as those described in Example 1. The thickness of the manufactured core layer was 50 μm, and the thickness of the cladding layer formation film material was 20 μm.

After the completion of the cladding layer formation film material which is the dry coating film formed on the base film of the flexible wiring substrate, the aforementioned core layer and cladding layer formation film material (where trenches had already been formed), which had been manufactured separately, were laminated such that the core layer was interposed between two cladding layer formation film materials. Next, a laminated body having a total of four layers including the flexible wiring substrate (hereinafter, referred to as a four-layer laminated body) was loaded into a laminator which had been set to 120° C., and was pressure bonded for five minutes at a pressure of 0.2 MPa so as to become thermocompression bonded.

Thereafter, second ultraviolet light was irradiated (in an irradiation quantity of 100 mJ/cm²) from a high-pressure mercury lamp or a metal halide lamp via a wavelength cutoff filter that occludes wavelengths of 300 nm or less onto the four-layer laminated body at room temperature and at normal pressure. After the irradiation of this ultraviolet light, the four-layer laminated body was immediately heated in a dryer at 150° C. for 30 minutes so that the cladding layer formation film material was cured (i.e., formed into cladding). Accordingly, the strengthening of the adhesive force between the core layer and the cladding layers was completed. As a result, a flexible belt-shaped cable body, where a rectilinear 3-layer optical waveguide (i.e., optical waveguide forming body) having a width of 0.5 cm, a length of 10 cm, a core layer thickness of 50 μm, a cladding layer thickness of 20 μm, and an overall thickness of 90 μm (i.e., the sum of the thickness of the single core layer and the thicknesses of the two cladding layers), and a flexible wiring substrate having an overall thickness of 17.5 μm, a width of 3 m, and a length of 10 m are mutually bonded together, was obtained. The optical waveguide forming body was positioned in the center of the width of the belt-shaped flexible wiring substrate, and was formed in a state of being bonded over the entire length thereof in the longitudinal direction of the flexible wiring substrate.

Note that the range where the internal air cladding portion was formed in the longitudinal direction of the optical waveguide forming body was made the same as in Example 1 using the trenches formed in the cladding layer formation film material. Moreover, the dimensions of the air layer in the obtained optical waveguide forming body in the width direction of the optical waveguide forming body, and also the dimensions thereof in the thickness direction of the optical waveguide forming body were also the same as in Example 1.

(Repeated Bending Test)

Figure 19A:
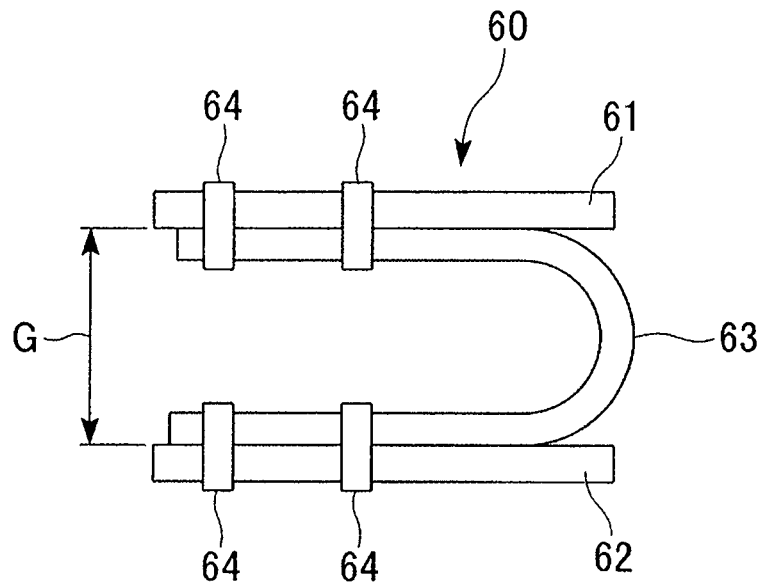
FIG. 19A is a view showing a testing apparatus that is used to perform a repeated bending test on a test piece of the cable body of Example 2 of the present invention, and shows an example of the position of a movable metal plate relative to a fixed metal plate.
Figure 19B:
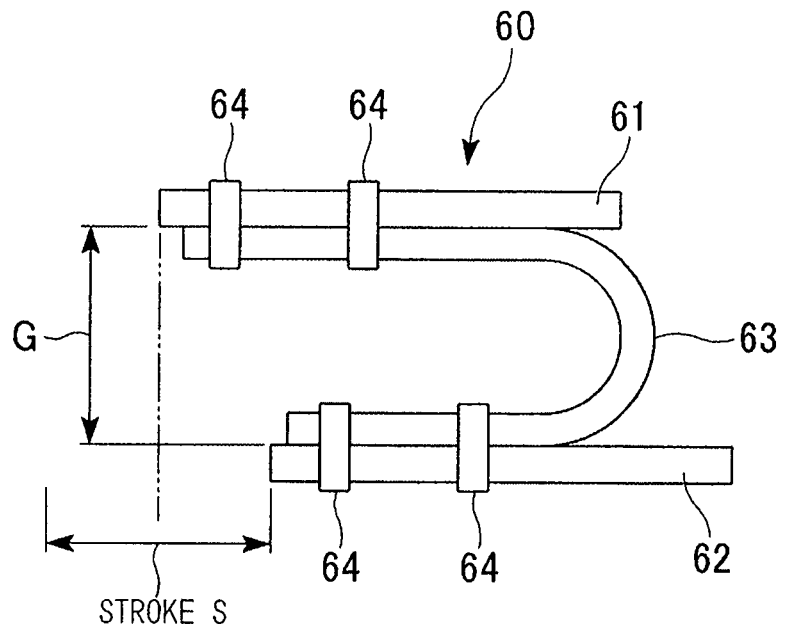
FIG. 19B is a view showing a testing apparatus that is used to perform a repeated bending test on a test piece of the cable body of Example 2 of the present invention, and shows another example of the position of a movable metal plate relative to a fixed metal plate.

A repeated bending test where vertical bending was repeatedly applied was performed using the repeated bending apparatus 60 shown in FIGS. 19A and 19B for the test pieces of Example 2.

The repeated bending apparatus 60 positions two metal plates 61 and 62 in parallel with each other with a gap G secured between them, and is able to reciprocatingly move the metal plate 62 in a horizontal direction (i.e., in the left and right directions in FIGS. 19A and 19B) relatively to the metal plate 61 which is fixed in a desired position (i.e., is a fixed metal plate) while maintaining the gap G. Hereinafter, the metal plate having the symbol 62 is also referred to as the movable metal plate.

The test piece 63 was bent in a U shape and positioned between the two metal plates 61 and 62, and the two ends in the longitudinal direction thereof were fixed to the metal plates 61 and 62 using fixing jigs 64. The movable metal plate 62 was then moved reciprocatingly at a stroke of 1.5 cm in order to impart repeated bending deformation to the test piece 63, and the condition of the test piece 63 was visually monitored.

As is shown in FIG. 19A, the test piece 63 was mounted by being bent in such a manner that half of the gap G between the two metal plates 61 and 62 conform to the bend radius. In the test piece 63, a sufficient length was secured between the portions where the two ends in the longitudinal direction were fixed to the metal plates 61 and 62 (i.e., the fixing jigs 64) such that the bend radius remained constant while the movable metal plate 62 was moving along the aforementioned stroke. Note that the mounting of the test piece 63 was oriented such that vertical bending is applied thereto.

Figure 20A:
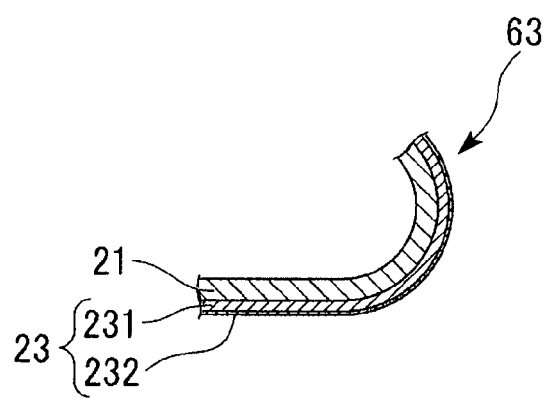
FIG. 20A is a view showing the mounting orientation of a test piece for the repeated bending testing apparatus shown in FIGS. 19A and 19B, and shows a case where the optical waveguide forming body has been positioned so as to face an inner circumferential side of a flexible wiring substrate in a bend portion of the test piece.
Figure 20B:
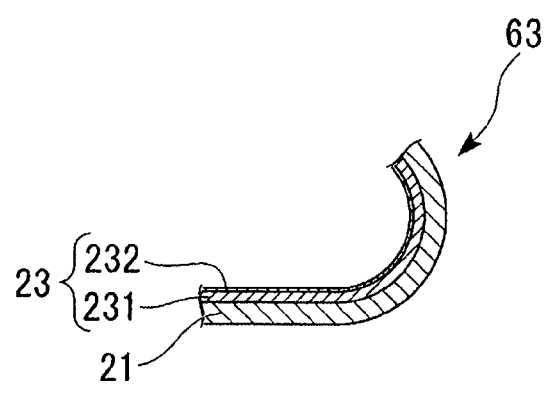
FIG. 20B is a view showing the mounting orientation of a test piece for the repeated bending testing apparatus shown in FIGS. 19A and 19B, and shows a case where the optical waveguide forming body has been positioned so as to face an outer circumferential side of a flexible wiring substrate in a bend portion of the test piece.

As is shown in FIGS. 20A and 20B, the tests were performed with the optical waveguide forming body 21 in the bend portion of the test piece 63 facing towards the inner circumferential side of the flexible wiring substrate 23 (see FIG. 20A—this is referred to below as a first orientation), and with the optical waveguide forming body 21 in the bend portion of the test piece 63 facing towards the outer circumferential side of the flexible wiring substrate 23 (see FIG. 20B—this is referred to below as a second orientation).

Note that the gap G between the two metal plates 61 and 62 was set to 3.1 mm (i.e., a bend radius of 1.5 mm).

The results of this experiment were as follow. Namely, in the case of the second orientation shown in FIG. 20B, the optical waveguide forming body 21 was fractured shortly after the reciprocating movement of the movable metal plate 62 commenced.

In contrast to this, in the case of the first orientation shown in FIG. 20A, even when the reciprocating movement of the movable metal plate 62 was performed 80,000 times, there was absolutely no sign of any abnormality in the optical waveguide forming body 21 of the test piece 63. From these results it was clear that, compared to the second orientation, the folding endurance of the optical waveguide forming body 21 in the first orientation was markedly improved.

The increased loss value measurement described with reference to FIGS. 17A and 17B was performed for the test piece 63 that experienced 80,000 reciprocating movements by the movable metal plate 62 in the first orientation shown in FIG. 20A. The results of this showed that the rectilinear insertion loss and the vertical bending insertion loss were approximately the same as in the test pieces that did not undergo the repeated bending test (for example, the test pieces having the numbers (i.e., the test piece numbers) 1, 5, 7, and 11 in FIG. 18). While, excess loss was also the same as in the test pieces having the numbers (i.e., the test piece numbers) 1, 5, 7, and 11 in FIG. 18.

Note that the present invention is not limited to the above described embodiments and appropriate modifications may also be made.

(a) It is preferable for the range where the internal air cladding portion is formed in the longitudinal direction of the cable body and the optical waveguide forming body to be wider (i.e., longer) than the deforming sections of the optical waveguide forming body and the cable body and to include these deforming sections. However, the present invention is not limited to this and appropriate modifications may be made. For example, it is also possible for this range to be equal to the deforming sections of the optical waveguide forming body and the cable body, or to be narrower (i.e., shorter) than the deforming section and within the range of the deforming section. Furthermore, the present invention may also be employed in structures where the entire length of the optical waveguide forming body in the longitudinal direction thereof is formed as an internal air cladding portion.

(b) In the above described embodiments, a cellular telephone having a structure where a transmitting microphone, an antenna, and a transmission and reception circuit are provided in a first body, and a display unit is provided in a second body is illustrated as an example of the cellular telephone of the present invention. However, the present invention is not limited to this. For example, it is also possible to use a cellular phone where the display unit is not provided in the second body and is only provided in the first body. Moreover, it is also possible to use a structure where a camera is provided in the first body or second body. Furthermore, the camera, display unit, antenna, and transmission and reception circuit may be provided in either the first body or the second body.

(c) In the above described embodiments, a cellular phone is illustrated where a light emitting element is provided in the first body side and a photoreceptor element is provided in the second body side. However, it is also possible to employ a structure where a photoreceptor element is provided in the first body side and a light emitting element is provided in the second body side. It is also possible for light emitting elements and photoreceptor elements to be provided in both the first body and the second body, and for the photoreceptor elements and light emitting elements to be connected using the flexible cable according to the present invention so that optical signals can be transmitted in both directions.

(d) The electronic apparatus and cellular phone of the present invention are not limited to structures that use a flexible cable including connectors. Structures that use flexible cables that do not include connectors are also included. Namely, it is also possible to employ a flexible cable that is formed solely by the above described optical waveguide forming body or solely by the above described cable body.

In this case, for example, one end of the flexible cable in the longitudinal direction of the optical waveguide forming body is fixed to a position where it is optically coupled with the optical element provided in the first body, while the other end is fixed to a position where it is optically coupled with the optical element provided in the second body.

(e) The electronic instrument of the present invention is not limited to being a cellular phone.

Electronic apparatuses to which the present invention can be applied are electronic apparatuses including a first body on which electronic components are mounted, a second body that is able to move relatively to the first body, and a flexible cable that is used to transmit signals between the first body and the second body, and the electronic apparatuses to which the present invention can be applied include all instruments that correspond to this. For example, in addition to various types of electronic apparatuses having movable display panels (the above described cellular telephones also correspond to this type) such as personal computers (notebook computers and desktop computers), video cameras, digital cameras, game machines, electronic dictionaries, PDA (personal digital assistants), and measuring instruments such as testers and the like, various types of instruments having electronic control mechanisms such as various types of NC control machine tools and the like are also included.

Moreover, it is preferable that the electronic apparatus of the present invention is one where the relative movement of the second body relative to the first body can be freely performed within a preset range (the aforementioned various types of electronic apparatuses having movable display panels correspond to this), or one where the relative movement of the second body relative to the first body is performed within a preset range by a drive apparatus that is used to move the second body relatively to the first body. Moreover, the electronic apparatus of the present invention has a structure that has a deforming section to which bending deformation is applied in conjunction with the relative movement of the second body relative to the first body. Furthermore, this structure is one where the air layer is provided at a position which is on the outer circumferential side of the core portion when bending deformation is applied to this deforming section. In other words, this structure is one where the bending deformation that is applied to the deforming section of the flexible cable is applied in such a direction that the air layer becomes located at a position on the outer circumferential side of the core portion.

[Industrial Applicability]

According to the electronic apparatus and cellular phone of the present invention, in an optical waveguide forming body of a flexible cable, an air layer is provided in a deforming section which experiences bending deformation as a result of the movement of a second body relative to a first body (either a pivoting or sliding movement), and the position of this air layer becomes located on the outer circumferential side of a core when the deforming section undergoes bending deformation. As a result of this, it is possible to ensure sufficient flexibility and to also achieve an improvement in the folding endurance of the core portion. Accordingly, as a result of the improved folding endurance of the optical waveguide forming body against repeated bending, it is possible to ensure sufficient folding endurance to make possible the practical utilization of an optical waveguide forming body. Moreover, it is possible to suppress light loss and achieve high-speed, large-capacity transmissions even when the optical waveguide forming body of a flexible cable experiences bending deformation due to the relative movement of the second body relative to the first body.

Moreover, if the method of manufacturing an optical waveguide forming body of the present invention is utilized, the structure of the flexible cable of the present invention becomes a simple one. Because of this, it is possible to obtain the optical waveguide forming body of the flexible cable easily and at low-cost.

What is claimed is:

1. An electronic apparatus, comprising:
   a first body on which a plurality of electronic components is mounted;
   a second body connected to the first body such that the second body moves relatively to the first body; and
   a flexible cable configured to transmit signals between the first body and the second body and comprising an optical waveguide forming body comprising a resin material,
   wherein the optical waveguide forming body is formed in a belt shape or a linear shape, the flexible cable has a deforming section that undergoes bending deformation in conjunction with relative movement of the second body relative to the first body, the optical waveguide forming body has at least one core portion extending in a longitudinal direction of the optical waveguide forming body, a plurality of cladding portions having a refractive index lower than a refractive index of the core portion and an internal air cladding portion positioned in contact with the core portion in the deforming section of the flexible cable, the internal air cladding portion has at least one air layer extending in the longitudinal direction of the optical waveguide forming body, and the air layer of the internal air cladding portion is positioned such that the air layer is on an outer circumferential side of the core portion when the bending deformation is applied to the deforming section.

2. The electronic apparatus according to claim 1, further comprising a hinge portion, wherein the second body is pivotably connected via the hinge portion to the first body, the flexible cable is laid so as to pass through the hinge portion, and the deforming section of the flexible cable is positioned in the vicinity of the hinge portion between the first body and the second body.

3. The electronic apparatus according to claim 1, wherein the second body is configured to slide relatively to the first body along guide rails in the first body, and the deforming section is configured to undergo the bending deformation in conjunction with sliding movement of the second body relative to the first body and is positioned between the first body and the second body.

4. The electronic apparatus according to claim 1, wherein the at least one air layer in the internal air cladding portion of the optical waveguide forming body includes an inner air layer positioned on an inner circumferential side such that the air layer and the inner air layer of the internal air cladding portion sandwich the core portion when the bending deformation is applied to the deforming section.

5. The electronic apparatus according to claim 1, further comprising a belt-shaped flexible wiring substrate extending through a length of the optical waveguide forming body and bonded to the optical waveguide forming body, and the first body is connected to the second body such that the bending deformation is applied to the deforming section in a direction that the optical waveguide forming body is on an inner circumferential side of the flexible wiring substrate.

6. The electronic apparatus according to claim 5, wherein the flexible wiring substrate has an electrically non-conductive base film, and a conductor layer provided on one surface of the electrically non-conductive base film, and the conductor layer is bonded to the optical waveguide forming body through the electrically non-conductive base film such that the conductor layer and the optical waveguide forming body are sandwiching the electrically non-conductive base film.

7. The electronic apparatus according to claim 5, wherein each of the first body and the second body has a cable connecting portion including a light emitting element or a photoreceptor element that is optically connected to the optical waveguide forming body of the flexible cable, each of the first body and the second body has an electrode portion electrically connected to a conductive circuit comprising the conductor layer of the flexible wiring substrate of the flexible cable, and the flexible cable has a plurality of connectors positioned at both ends of the flexible cable and forming optical connections between the optical waveguide forming body and the light emitting and photoreceptor elements and electrical connections between the conductive circuit comprising the conductor layer of the flexible wiring substrate and the electrode portion.

8. The electronic apparatus according to claim 6, wherein each of the first body and the second body has a cable connecting portion including a light emitting element or a photoreceptor element that is optically connected to the optical waveguide forming body of the flexible cable, each of the first body and the second body has an electrode portion electrically connected to a conductive circuit comprising the conductor layer of the flexible wiring substrate of the flexible cable, and the flexible cable has a plurality of connectors positioned at both ends of the flexible cable and forming optical connections between the optical waveguide forming body and the light emitting and photoreceptor elements and electrical connections between the conductive circuit comprising the conductor layer of the flexible wiring substrate and the electrode portion.

9. The electronic apparatus according to claim 1, wherein the optical waveguide forming body has a core layer in which the at least one core portion is formed and a plurality of cladding layers in which the cladding portions are formed, the cladding layers have a refractive index which is lower than the refractive index of the core portion, the core portion is formed in a plurality, the air layer is formed in a plurality, the plurality of air layers are secured by a plurality of trenches formed in the optical waveguide forming body and extending in the longitudinal direction of the optical waveguide forming body such that the trenches are facing the core portions of the core layer.

10. The electronic apparatus according to claim 9, wherein the core layer of the optical waveguide forming body has a primary material comprising a cyclic olefin-based resin, and the core portions are formed by irradiation of active energy light rays or electron beams onto a plurality of portions of the core layer comprising a resin composition having a refractive index which is changed by the irradiation or by application of heat.

11. A cellular phone comprising the electronic apparatus according to any one of claims 1 through 10.

12. The electronic apparatus according to claim 1, wherein the air layer is secured by a trench formed in the optical waveguide forming body and extending in the longitudinal direction of the optical waveguide forming body such that the trench is facing the core portion of the core layer, and the optical waveguide forming body is produced by a method of manufacturing an optical waveguide forming body comprising: after irradiating ultraviolet light onto portions of a core layer formation film material comprising a first photo-acid generating agent that is activated by irradiation of ultraviolet light and generates an acid in a polymer having a main chain and a leaving group that branches off the main chain, heating the core layer formation film material such that a refractive index difference is formed between irradiated areas of the core layer formation material where the ultraviolet light is irradiated and non-irradiated areas where the ultraviolet light is not irradiated, the core layer formation material is cured, and the core layer of the optical waveguide forming body is formed; thermocompression bonding a cladding layer formation film material onto both sides of the core layer such that a material laminated body comprising the core layer and the cladding layer formation film material is formed, the cladding layer formation film material having the trench formed on one surface of the cladding layer formation film material and formed in a film shape from a material comprising a second photo-acid generating agent that has an absorption maximum wavelength different from an absorption maximum wavelength of the first photo-acid generating agent and that is activated by irradiation of ultraviolet light and generates an acid in a polymer having a polymeric group; and after irradiating ultraviolet light having a wavelength that includes the absorption maximum wavelength of the second photo-acid generating agent but does not include the absorption maximum wavelength of the first photo-acid generating agent onto the material laminated body, heating the material laminated body such that the cladding layer formation film material is cured and the cladding layers are formed.

13. A flexible cable for an electronic apparatus comprising a first body and a second body that pivots or slides relatively to the first body, comprising:
an optical waveguide forming body comprising a resin material and formed in a belt shape or a linear shape, wherein the optical waveguide forming body has a plurality of cladding layers, a core layer interposed between the cladding layers and an internal air cladding portion formed in a portion of the optical waveguide forming body and extending in a longitudinal direction of the optical waveguide forming body, the core layer has at least one core portion, the cladding layers have a refractive index which is lower than a refractive index of the core portion, and the internal air cladding portion has at least one air layer in contact with the core portion and is secured by a trench formed in the optical waveguide forming body and extending in the longitudinal direction of the optical waveguide forming body such that the trench is facing the core portion of the core layer.

14. The flexible cable according to claim 13, further comprising a belt-shaped flexible wiring substrate extending through a length of the optical waveguide forming body and bonded to the optical waveguide forming body.

15. The flexible cable according to claim 14, wherein the flexible wiring substrate has an electrically non-conductive base film and a conductor layer provided on one surface of the electrically non-conductive base film, and the conductor layer is bonded to the optical waveguide forming body through the electrically non-conductive base film such that the conductor layer and the optical waveguide forming body are sandwiching the electrically non-conductive base film.

16. The flexible cable according to claim 15, further comprising a plurality of connectors positioned at both ends of the flexible cable and configured to form optical connections between optical elements in the electronic apparatus and the optical waveguide forming body electrical connections between electronic circuits in the electronic apparatus and a conductive circuit comprising the conductor layer of the flexible wiring substrate.

17. The flexible cable according to claim 14, further comprising a plurality of connectors positioned at both ends of the flexible cable and configured to form optical connections between optical elements in the electronic apparatus and the optical waveguide forming body and electrical connections between electronic circuits in the electronic apparatus and a conductive circuit comprising the conductor layer of the flexible wiring substrate.

18. The flexible cable according to claim 13, wherein the optical waveguide forming body is produced by a method of manufacturing an optical waveguide forming body comprising: after irradiating ultraviolet light onto portions of a core layer formation film material comprising a first photo-acid generating agent that is activated by irradiation of ultraviolet light and generates an acid in a polymer having a main chain and a leaving group that branches off the main chain, heating the core layer formation film material such that a refractive index difference is formed between irradiated areas of the core layer formation material where the ultraviolet light is irradiated and non-irradiated areas where the ultraviolet light is not irradiated, the core layer formation material is cured, and the core layer of the optical waveguide forming body is formed; thermocompression bonding a cladding layer formation film material onto both sides of the core layer such that a material laminated body comprising the core layer and the cladding layer formation film material is formed, the cladding layer formation film material having the trench formed on one surface of the cladding layer formation film material and formed in a film shape from a material comprising a second photo-acid generating agent that has an absorption maximum wavelength different from an absorption maximum wavelength of the first photo-acid generating agent and that is activated by irradiation of ultraviolet light and generates an acid in a polymer having a polymeric group; and after irradiating ultraviolet light having a wavelength that includes the absorption maximum wavelength of the second photo-acid generating agent but does not include the absorption maximum wavelength of the first photo-acid generating agent onto the material laminated body, heating the material laminated body such that the cladding layer formation film material is cured and the cladding layers are formed.

19. A method of manufacturing an optical waveguide forming body that is made of resin and is flexible and is formed in a belt shape or a linear shape, the optical waveguide forming body including a core layer having either one or a plurality of core portions between a pair of cladding layers having a refractive index lower than a refractive index of the core portions and an internal air cladding portion positioned in a center portion in a longitudinal direction of the optical waveguide forming body, air layers that are in contact with the core portions being secured by trenches that are formed in locations facing the core portions of the core layer, the method comprising:

after irradiating ultraviolet light onto portions of a core layer formation film material comprising a first photo-acid generating agent that is activated by irradiation of ultraviolet light and generates an acid in a polymer having a main chain and a leaving group that branches off the main chain, heating the core layer formation film material such that a refractive index difference is formed between irradiated areas of the core layer formation material where the ultraviolet light is irradiated and non-irradiated areas where the ultraviolet light is not irradiated, the core layer formation material is cured, and the core layer of the optical waveguide forming body is formed;

thermocompression bonding a cladding layer formation film material onto both sides of the core layer such that a material laminated body comprising the core layer and the cladding layer formation film material is formed, the cladding layer formation film material having the trenches formed on one surface of the cladding layer formation film material and formed in a film shape from a material comprising a second photo-acid generating agent that has an absorption maximum wavelength different from an absorption maximum wavelength of the first photo-acid generating agent and that is activated by irradiation of ultraviolet light and generates an acid in a polymer having a polymeric group; and after irradiating ultraviolet light having a wavelength that includes the absorption maximum wavelength of the second photo-acid generating agent but does not include the absorption maximum wavelength of the first photo-acid generating agent onto the material laminated body, heating the material laminated body such that the cladding layer formation film material is cured and the cladding layers are formed.

20. The method of manufacturing an optical waveguide forming body according to claim 19, wherein, in the thermocompression bonding, a varnish comprising the cladding layer formation material is coated onto a flexible wiring substrate so as to form the cladding layer formation film material, and the cladding layer formation film material and a separately manufactured cladding layer formation film material and the core layer are mutually laminated and thermocompression-bonded together.

21. The method of manufacturing an optical waveguide forming body according to claim 20, wherein at least one of the polymer of the core layer formation film material and the polymer of the cladding layer formation film material are norbornene-based polymers.

22. The method of manufacturing an optical waveguide forming body according to claim 19, wherein at least one of the polymer of the core layer formation film material and the polymer of the cladding layer formation film material are norbornene-based polymers.

\* \* \* \* \*